US012638349B2

(12) United States Patent
Komori et al.

(10) Patent No.: US 12,638,349 B2
(45) Date of Patent: May 26, 2026

(54) ELECTRIC WIRE INSPECTION SYSTEM, ELECTRIC WIRE INSPECTION METHOD, AND ELECTRIC WIRE

(71) Applicants:AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Hirokazu Komori, Yokkaichi (JP); Takahiro Murata, Yokkaichi (JP); Fujio Sonoda, Osaka (JP); Takumi Ooshima, Kanuma (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 127 days.

(21) Appl. No.: 18/692,982

(22) PCT Filed: Oct. 6, 2021

(86) PCT No.: PCT/JP2021/036963
§ 371 (c)(1),
(2) Date: Mar. 18, 2024

(87) PCT Pub. No.: WO2023/058149
PCT Pub. Date: Apr. 13, 2023

(65) Prior Publication Data
US 2025/0004032 A1     Jan. 2, 2025

(51) Int. Cl.
G01L 5/10          (2020.01)
G01L 1/12          (2006.01)
(Continued)

(52) U.S. Cl.
CPC .................. G01L 5/10 (2013.01); G01L 1/12 (2013.01); G01L 1/20 (2013.01); G01R 27/16 (2013.01);
(Continued)

(58) Field of Classification Search
USPC ......................................................... 324/533
See application file for complete search history.

(56) References Cited

U.S. PATENT DOCUMENTS 4,988,949  A  *  1/1991  Boenning .............. G01R 31/58
                                                    324/541
6,011,399  A       1/2000  Matsumaru et al.
                   (Continued)

FOREIGN PATENT DOCUMENTS

CN        107576879  A       1/2018
CN        208860914  U       5/2019
                   (Continued)

OTHER PUBLICATIONS

Jan. 21, 2025 Office Action issued in Japanese Patent Application No. 2023-552472.
(Continued)

*Primary Examiner* — Farhana A Hoque
(74) *Attorney, Agent, or Firm* — Oliff PLC

(57) ABSTRACT

An electric wire inspection system and method that can sensitively detect damage on an electric wire, and an electric wire capable of being inspected using the same. The electric wire inspection system includes: an inspection unit which performs electric wire inspection wherein a characteristic impedance between two conductive members of the electric wire is obtained as a response signal by time domain or frequency domain reflectometry; a storage unit which stores the response signal obtained at a first time point; and an analysis unit which retrieves the response signal obtained at
(Continued)

the first time point from the storage unit, compares it with the response signal obtained at a second time point later than the first time point, and, if a difference exists between the two response signals, correlates a region in which the difference exists in the response signals with a position along an axial direction of the electric wire.

16 Claims, 17 Drawing Sheets

(51) Int. Cl.

| | |
|---|---|
| *G01L 1/20* | (2006.01) |
| *G01R 27/16* | (2006.01) |
| *G01R 31/08* | (2020.01) |
| *G01R 31/11* | (2006.01) |
| *H01B 5/14* | (2006.01) |
| *H01B 7/00* | (2006.01) |
| *H01B 7/32* | (2006.01) |
| *H01B 9/00* | (2006.01) |

(52) U.S. Cl.
CPC ............ *G01R 31/088* (2013.01); *G01R 31/11* (2013.01); *H01B 5/14* (2013.01); *H01B 7/32* (2013.01); *H01B 9/003* (2013.01); *H01B 7/0045* (2013.01)

(56) References Cited

U.S. PATENT DOCUMENTS

| | | | |
|---|---|---|---|
| 6,265,880 | B1 | 7/2001 | Born et al. |
| 6,754,736 | B1 | 6/2004 | Ogawa et al. |
| 2002/0038199 | A1 | 3/2002 | Blemel |
| 2003/0206111 | A1 | 11/2003 | Gao et al. |
| 2004/0046570 | A1 | 3/2004 | Teich |
| 2007/0021941 | A1 | 1/2007 | Blemel |
| 2010/0253364 | A1 | 10/2010 | Ganesh |
| 2011/0035168 | A1 | 2/2011 | Lelong et al. |
| 2011/0309845 | A1 | 12/2011 | Kukowski |
| 2012/0082422 | A1 | 4/2012 | Sarchi et al. |
| 2012/0103647 | A1 | 5/2012 | Frey |
| 2013/0335102 | A1 | 12/2013 | Chirgwin et al. |
| 2014/0312907 | A1 | 10/2014 | Tong et al. |
| 2015/0025820 | A1 | 1/2015 | Auzanneau et al. |
| 2018/0108484 | A1 | 4/2018 | Jacobs et al. |

FOREIGN PATENT DOCUMENTS

| | | |
|---|---|---|
| JP | S51-150478 U | 12/1976 |
| JP | S59-79918 U | 5/1984 |
| JP | S63-157067 A | 6/1988 |
| JP | H04-326072 A | 11/1992 |
| JP | H06-194401 A | 7/1994 |
| JP | H07-262837 A | 10/1995 |
| JP | H07-282644 A | 10/1995 |
| JP | H08-184626 A | 7/1996 |
| JP | H08-271356 A | 10/1996 |
| JP | H09-189740 A | 7/1997 |
| JP | H09-198941 A | 7/1997 |
| JP | H11-258011 A | 9/1999 |
| JP | H11-332086 A | 11/1999 |
| JP | 2001-4462 A | 1/2001 |
| JP | 2001-014177 A | 1/2001 |
| JP | 2001-141770 A | 5/2001 |
| JP | 2005-166450 A | 6/2005 |
| JP | 2006-518030 A | 8/2006 |
| JP | 2007-305478 A | 11/2007 |
| JP | 2007-333468 A | 12/2007 |
| JP | 2008-124186 A | 5/2008 |
| JP | 2010-021049 A | 1/2010 |
| JP | 2011-523043 A | 8/2011 |
| JP | 2011-217340 A | 10/2011 |
| JP | 2012-099479 A | 5/2012 |
| JP | 2015-013575 A | 1/2015 |
| JP | 2016-510876 A | 4/2016 |
| JP | 2017-142961 A | 8/2017 |
| JP | 2018-056287 A | 4/2018 |
| JP | 2018-156824 A | 10/2018 |
| JP | 2019-035648 A | 3/2019 |
| JP | 2019-128215 A | 8/2019 |
| JP | 2019-190875 A | 10/2019 |
| JP | 2020-015176 A | 1/2020 |
| JP | 2020-015179 A | 1/2020 |
| JP | 2020-63441 A | 4/2020 |
| WO | 2004/023673 A1 | 3/2004 |
| WO | 2014/136037 A1 | 9/2014 |

OTHER PUBLICATIONS

Apr. 30, 2025 Office Action issued in Chinese Patent Application No. 202180023335.3.

Sep. 27, 2024 Office Action issued in U.S. Appl. No. 17/913,584 in the name of Sonoda.

Dec. 21, 2021, International Search Report issued in International Patent Application No. PCT/JP2021/036963.

Apr. 9, 2025 Office Action issued in U.S. Appl. No. 17/913,584.

Nov. 5, 2024 Office Action issued in Japanese Patent Application No. 2023-552472.

Feb. 15, 2022 Search Report issued in International Patent Application No. PCT/JP2021/043345.

U.S. Appl. No. 18/692,969, filed Mar. 18, 2024 in the name of Komori et al.

* cited by examiner

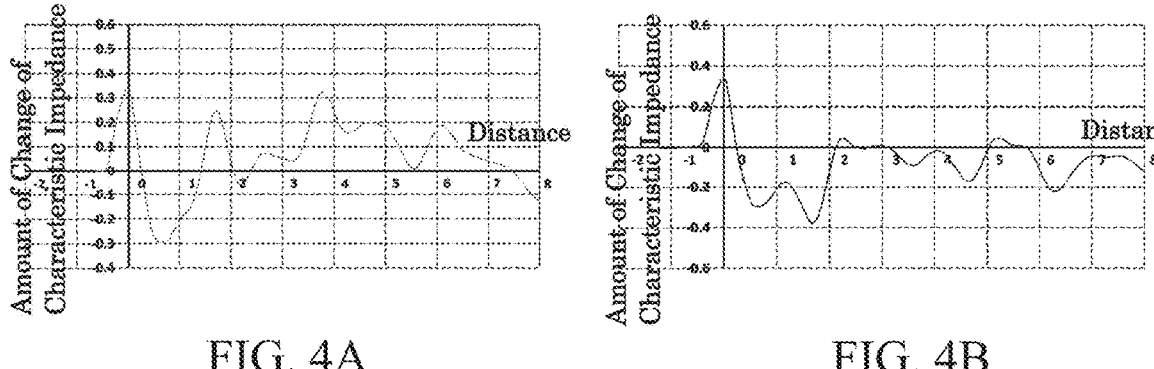
FIG. 4A                    FIG. 4B
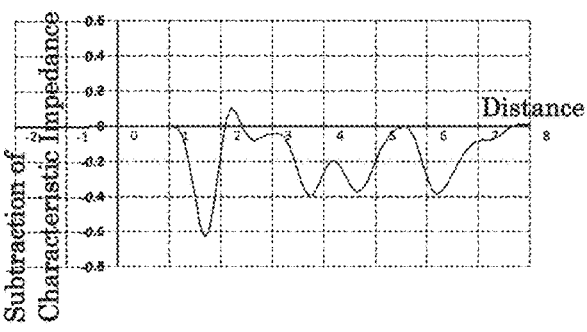
FIG. 4C
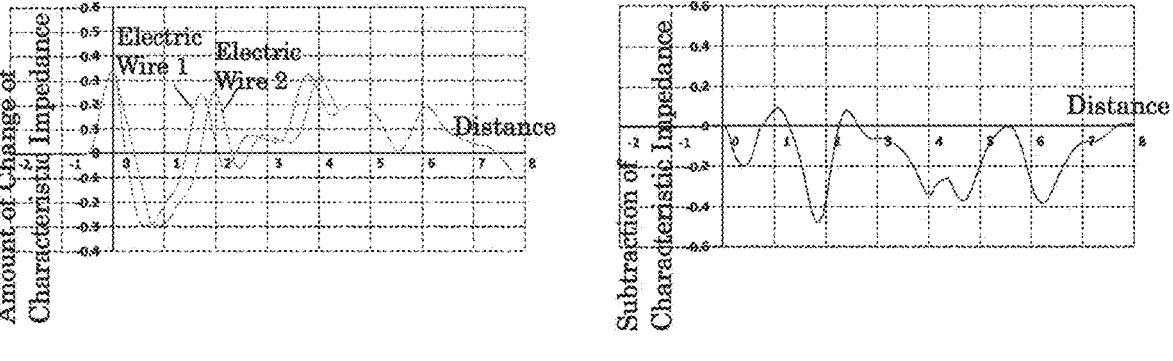
FIG. 4D                    FIG. 4E

ELECTRIC WIRE INSPECTION SYSTEM, ELECTRIC WIRE INSPECTION METHOD, AND ELECTRIC WIRE

TECHNICAL FIELD

The present disclosure relates to an electric wire inspection system, an electric wire inspection method, and an electric wire.

BACKGROUND ART

Electric wires are installed and routed in various types of electrical and electronic devices, transportation devices, buildings, public facilities, and the like, and with long-term use of an electric wire, damage may occur to the electric wire, such as disconnection, a short circuit, or external damage. For example, due to contact or friction between an electric wire and an object around the electric wire, damage may occur to the insulation coating surrounding the electric wire. It is desirable to detect the occurrence of damage as early and sensitively as possible to avoid serious effects of damage on the wire performance. Methods for detecting damage on an electric wire are disclosed in Patent Literatures 1 to 24.

For example, as a method for detecting damage on an electric wire, Patent Literature 11 discloses a cable diagnostic device including: a setting means for setting a propagation speed of a pulse electrical signal for each of a plurality of sections in a cable path to be diagnosed; and an estimating means for estimating the location of a defective point in the cable path based on a measurement result of reflection characteristics of the pulse electrical signal transmitted in the cable path and the propagation speed set for each section. Here, the propagation speed in each section is set by reading and setting data such as the number of cable paths using CAD, a table indicating the relationship between the number of cables and the propagation speed is prepared in advance through experiments, and the propagation speed corresponding to the number of cables in each section of the cable path is automatically set.

CITATION LIST

Patent Literature

Patent Literature 1: JP S63-157067 A
Patent Literature 2: JP H4-326072 A
Patent Literature 3: JP H6-194401 A
Patent Literature 4: JP H7-262837 A
Patent Literature 5: JP H7-282644 A
Patent Literature 6: JP H8-184626 A
Patent Literature 7: JP H11-332086 A
Patent Literature 8: JP 2001-14177 A
Patent Literature 9: JP 2006-518030 A
Patent Literature 10: JP 2007-305478 A
Patent Literature 11: JP 2007-333468 A
Patent Literature 12: JP 2001-141770 A
Patent Literature 13: JP 2010-21049 A
Patent Literature 14: JP 2011-217340 A
Patent Literature 15: JP 2017-142961 A
Patent Literature 16: JP 2019-128215 A
Patent Literature 17: JP 2019-190875 A
Patent Literature 18: JP 2020-15176 A
Patent Literature 19: U.S. Pat. No. 4,988,949 B2
Patent Literature 20: U.S. Pat. No. 6,265,880 B2
Patent Literature 21: US 2003/206111 A
Patent Literature 22: US 2007/021941 A
Patent Literature 23: US 2010/253364 A
Patent Literature 24: US 2011/309845 A

SUMMARY OF INVENTION

Technical Problem

When an inspection signal is input to a member of an electric wire to determine, based on a response signal obtained, the presence or absence of damage on the electric wire and identify the position of damage, it is necessary to perform comparison with a response signal when no damage is present and calculation taking into account the characteristics of the electric wire. In this case, as the response signal to be compared or the characteristics of the electric wire to be used as the basis for the calculation, basic information obtained based on prior testing or theory is used.

However, when inspection is performed using basic information that is based on prior testing or theory, damage on an electric wire may not be detected accurately. For example, factors other than the occurrence of damage, such as variations in the structure and characteristics of electric wires within a production allowance, may affect the behavior of the response signal. In such cases, it may be difficult to distinguish change in the response signal caused by damage from change caused by the influence of other factor than damage. In particular, it is difficult to detect damage using the basic information when damage on an electric wire causes only a small change in the response signal such as when damage remains only on the surface of the electric wire, or when the electric wire has a structure that influences on the response signal such as branched portions and a signal originating from the structure causes difficulty in clearly recognizing change in the response signal due to damage.

In view of the above, it is an object of the present invention to provide an electric wire inspection system and an electric wire inspection method that can sensitively detect damage on an electric wire, and an electric wire capable of being inspected using such an electric wire inspection system and electric wire inspection method.

Solution to Problem

An electric wire inspection system according to an aspect of the present disclosure is for inspecting a damage state of an electric wire, the electric wire containing: a core wire containing a conductor and an insulation coating; and a damage detection member comprising two conductive members which are electrically insulated from each other and are composed of at least one of components of the core wire or components of the electric wire other than the core wire disposed along the core wire. The electric wire inspection system contains an inspection unit, a storage unit, and an analysis unit. The inspection unit performs electric wire inspection at a first time point and a second time point later than the first time point, by inputting to the two conductive members an electrical signal that contains an alternating-current component as an inspection signal, and obtaining by time domain reflectometry or frequency domain reflectometry a characteristic impedance between the two conductive members, as a response signal. The storage unit stores the response signal obtained in the electric wire inspection performed by the inspection unit at the first time point. The analysis unit retrieves the response signal obtained at the first time point from the storage unit, compare the response signal obtained at the first time point with the response signal obtained at the first time point with the response signal obtained in the electric wire inspection performed by the inspection unit at the second time point, and, if a difference exists between the two response signals, correlates a region in which the difference exists in the response signals with a position along an axial direction of the electric wire.

An electric wire inspection method according to an aspect of the present disclosure is performed using the electric wire inspection system. The electric wire inspection method the contains an initial data obtaining step in which the electric wire inspection of the electric wire is performed by the inspection unit at the first time point and the response signal is obtained; a data storage step in which the response signal obtained in the initial data obtaining step is stored in the storage unit; a measurement step in which the electric wire inspection of the electric wire at the second time point is performed by the inspection unit; and an analysis step in which the response signal obtained at the first time point is retrieved by the analysis unit from the storage unit and is compared with the response signal obtained in the measurement step at the second time point, and, if a difference exists between the two response signals, a region in which the difference exists in the response signals is correlated with a position along the axial direction of the electric wire.

A first electric wire according to an aspect of the present disclosure contains a core wire containing a conductor and an insulation coating surrounding the conductor, and a conductive tape as detection tape arranged on an outer peripheral surface of the core wire. The conductive tape contains a base material made of a tape-shaped insulator or a semiconductor, and a conductive layer made of a conductive material and formed on one surface of the base material. The conductive tape is wound around the core wire in a spiral shape without any gaps, and the conductive layer is not in contact with each other between adjacent turns of the spiral shape.

A second electric wire according to an aspect of the present disclosure contains a core wire containing a conductor and an insulation coating surrounding the conductor, and a laminated tape as detection tape arranged on an outer peripheral surface of the core wire. The laminated tape contains a base material made of a tape-shaped insulator or a semiconductor, and conductive coating layers formed on both surfaces of the base material.

The laminated tape is wound around the core wire in a spiral shape without any gaps, and the coating layers are not in contact with each other between adjacent turns of the spiral shape.

Advantageous Effects of Invention

The electric wire inspection system and the electric wire inspection method according to aspects of the present disclosure are an electric wire inspection system and an electric wire inspection method that can sensitively detect damage on an electric wire. Also, the electric wire according to an aspect of the present disclosure is an electric wire that can be inspected by the electric wire inspection system and the electric wire inspection method.

BRIEF DESCRIPTION OF DRAWINGS

FIGS. 4A to 4C show examples of response signals obtained through the electric wire inspection for the electric wire in FIG. 3, where FIG. 4A shows a response signal obtained when no damage is present in an electric wire 1, FIG. 4B shows a response signal obtained when damage is present in the electric wire 1, and FIG. 4C shows subtractions between the case where damage is present and the case where damage is not present at the electric wire 1. FIG. 4D shows a comparison between response signals for the electric wire 1 and an electric wire 2 in the case where damage is not present, and FIG. 4E shows subtractions between the response signals for the electric wire 1 and the electric wire 2 in the case where damage is not present.

FIG. 6A shows the case where damage is not present at the conductive tape, and FIG. 6B shows the case where damage is present at the conductive tape.

FIG. 7A shows the case where damage is not present at the conductive layer, and FIG. 7B shows the case where damage is present at the conductive layer.

FIG. 11A is a perspective view, and FIG. 11B is a cross-sectional view taken perpendicular to the axial direction.

FIG. 16A shows the measurement results of the wire having no external damage, FIG. 16B shows measurement results of the wire having external damage, and FIG. 16C shows subtraction signals.

FIG. 17A shows the measurement results of the wire having no external damage, FIG. 17B shows the measurement results of the wire with the laminated tape broken, and FIG. 17C shows subtraction signals.

FIG. 18A shows measurement results of the wire having no external damage, FIG. 18B shows the measurement results with two conductive layers of the laminated tape short-circuited, and FIG. 18C shows subtraction signals.

DESCRIPTION OF EMBODIMENTS

Description of Embodiments of Present Disclosure

Figure 1:
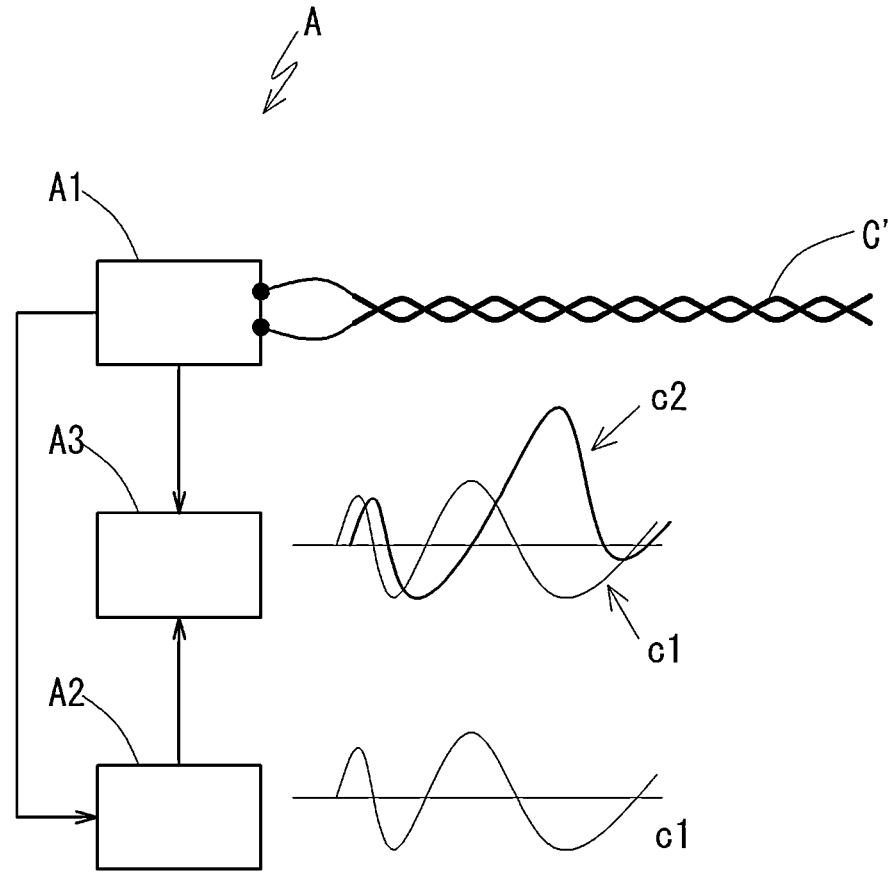
FIG. 1 is a schematic view of an electric wire inspection system according to one embodiment of the present disclosure.

First, embodiments of the present disclosure will be described.

An electric wire inspection system according to an aspect of the present disclosure is an electric wire inspection system for inspecting a damage state of an electric wire, the electric wire containing: a core wire comprising a conductor and an insulation coating; and a damage detection member comprising two conductive members which are electrically insulated from each other and are composed of at least one of components of the core wire or components of the electric wire other than the core wire disposed along the core wire, in which the electric wire inspection system containing: an inspection unit which performs electric wire inspection at a first time point and a second time point later than the first time point, by inputting to the two conductive members an electrical signal that contains an alternating-current component as an inspection signal, and obtaining by time domain reflectometry or frequency domain reflectometry a characteristic impedance between the two conductive members, as a response signal; a storage unit which stores the response signal obtained in the electric wire inspection performed by the inspection unit at the first time point; and an analysis unit which retrieves the response signal obtained at the first time point from the storage unit, compare the response signal obtained at the first time point with the response signal obtained in the electric wire inspection performed by the inspection unit at the second time point, and, if a difference exists between the two response signals, correlates a region in which the difference exists in the response signals with a position along an axial direction of the electric wire.

In the electric wire inspection system described above, the response signal obtained by electric wire inspection performed at the first time point is stored in the storage unit, and the response signal obtained by performing electric wire inspection at the second time point is compared with the response signal that was obtained at the first time point and retrieved from the storage unit. If damage (or a precursor thereof; the same applies below) is present in the electric wire, the characteristic impedance between the two conductive members of the electric wire changes. Thus, if damage occurs in the electric wire between the first time point and the second time point, the damage can be detected by detecting change in the response signals. For the same electric wire, the response signal obtained at the first time point and the response signal obtained later at the second time point are directly compared with each other, and therefore if change occurs in the response signal due to the occurrence of damage on the electric wire, such change can be sensitively detected, to thereby detect the occurrence of the damage. Since the response signal for an individual electric wire is observed over time, even if a signal component originating from the structure or characteristics of the electric wire appear in the response signal, change in the response signal caused by damage can be distinguished from such a signal component and detected.

Further, in the electric wire inspection system, electric wire inspection is performed by measuring the characteristic impedance between two conductive members using time domain reflectometry or frequency domain reflectometry. Based on information of the region where the change occurs in the characteristic impedance in the response signal, the region where the change occurs in the characteristic impedance can be correlated with a position along the axial direction of the electric wire using time domain reflectometry or frequency domain reflectometry through performing operation, where appropriate. Further, the position can be correlated with the position where damage is present in the electric wire. Accordingly, the position where damage is present along the axial direction of the electric wire can be easily identified with high accuracy. Measurement using reflectometry can be performed simply by connecting a measuring device to one end of the electric wire, allowing easy on-the-spot detection of damage even when the electric wire cannot be removed easily.

Here, it is preferable that the analysis unit calculates a subtraction between the response signal obtained at the first time point and the response signal obtained at the second time point, and determines whether or not the difference exists between the two response signals based on the subtraction. By obtaining the subtraction between two response signals, if damage occurs to the electric wire between the first time point and the second time point, causing change in the response signals, the change can be sensitively detected. This is because, even if the electric wire contains an element such as a branched portion that generates a structure such as a peak or waviness in the response signal, by using the difference, it is possible to cancel out the contribution of such an element in the response signal, and to emphasize the influence of damage in the response signal.

In this case, it is preferable that inspection signal contains superimposition of signal components existing over a continuous frequency range and having mutually independent intensities, and has excluded frequencies as a part of the continuous frequency range at which frequency components have no intensities or discontinuously smaller intensities compared to adjacent frequencies. In the electric wire inspection, the characteristic impedance between the two conductive members is preferably measured as the response signal by time domain reflectometry. In this case, damage detection can be performed by taking both advantages of using time domain reflectometry (e.g., information about the time in which characteristic impedance changes can be directly converted into information about the position at which damage is present in the electric wire) and advantages of the benefits of using an inspection signal in which different frequency components are superimposed with each other (e.g., the influence of external noise can be reduced when measuring the characteristic impedance). In particular, if the inspection signal existing over a continuous frequency range has a frequency range at which the frequency components have no intensities or discontinuously smaller intensities, the influence of noise in the frequency components can be reduced effectively.

It is preferable that in the inspection signal, the excluded frequencies include a frequency of an electromagnetic wave originating from a source external to the electric wire and propagating around the electric wire. With this arrangement, when the electric wire to be inspected is used in an environment where other communication devices or electric wires for communication locate in the vicinity, such as inside an automobile, if the waveform of the inspection signal is made to exclude the frequency used for communication by such a neighboring device, measurement of the characteristic impedance using the inspection signal and damage detection based on the measurement result can be performed while reducing the influence of noise caused by communication of the neighboring device.

It is preferable that the electric wire to be inspected has a branched portion in the middle thereof. If the electric wire has a branched portion, a large structural component is generated in the inspection signal or the response signal due to the branched portion in many cases, and change in the response signal caused by damage tends to be buried. However, for the electric wire to be detected, by retrieving the response signal obtained at the first time point and comparing it with the response signal obtained at the second time point, damage can be accurately detected even if a signal component originating from a branched portion causes any effects on the response signal.

It is preferable that the electric wire to be inspected contains a conductive tape spirally wound around an outer circumference of the core wire, and the conductor of the core wire and the conductive tape constitute the two conductive members of the damage detection member. With this case, if external damage occurs in the electric wire, and damage is also formed in the conductive tape, the characteristic impedance between the conductive tape and the conductor of the core wire changes. Therefore, by measuring the characteristic impedance between the conductive tape and the conductor of the core wire, it is possible to sensitively detect the presence of external damage on the electric wire, or a precursor of the formation of external damage.

In this case, it is preferable that the conductive tape contains a base material made of a tape-shaped insulator or a semiconductor, and a conductive layer made of a conductive material and formed on one surface of the base material, in which the conductive tape is wound around the core wire in a spiral shape without any gaps, and the conductive layer is not in contact with each other between adjacent turns of the spiral shape. Since the conductive tape is wound around the core wire without any gaps, external damage can be detected regardless of the position of external damage formed in a circumferential direction or axial direction of the electric wire.

It is preferable that the core wire is a composite wire containing a plurality of insulated wires each comprising the conductor and the insulation coating surrounding the conductor, and the conductive tape is spirally wound around the outer circumference of the entire composite wire. With this arrangement, regardless of the configuration of the composite wire, such as the shape, thickness, or type of insulated wires contained, any damage formed on the outer circumference of the entire composite wire can be sensitively detected using the conductive tape.

Alternatively, it is preferable that the electric wire to be inspected contains a laminated tape wound around the core wire, the laminated tape comprising a base material made of a tape-shaped insulator or a semiconductor, and conductive coating layers formed on both surfaces of the base material, in which the two coating layers of the laminated tape constitute the two conductive members of the damage detection member. In this case, if external damage occurs in the electric wire, and damage is also formed in the laminated tape, such as breakage in the coating layers or a short circuit between the coating layers, the characteristic impedance between the two coating layers changes. Therefore, by measuring the change in characteristic impedance between the two coating layers, the presence of damage on the electric wire can be sensitively detected. Since measurement is performed between the two coating layers provided on the laminated tape, a damage detection function can be provided in various types of electric wires by simply wounding the laminated tape around the electric wire.

In this case, it is preferable that the core wire is a composite wire containing a plurality of insulated wires each containing the conductor and the insulation coating surrounding the conductor, and the laminated tape is spirally wound around the outer circumference of the entire composite wire. With this arrangement, regardless of the configuration of the composite wire, such as the shape, thickness, or type of insulated wires contained, any damage formed on the outer circumference of the entire composite wire can be sensitively detected using the laminated tape.

It is preferable that the laminated tape is wound around the core wire in a spiral shape without any gaps, and the coating layers are not in contact with each other between turns of the spiral shape. In this arrangement, the laminated tape is wound around the core wire without any gaps, so that external damage can be detected even if external damage is formed at any position in circumferential or axial direction of the electric wire.

It is preferable that the base material has an electrical characteristic that changes depending on external environments. In this case, the change of external environments, such as the external temperature or humidity, causes change in the electrical characteristic of the base material, and also may cause change in characteristic impedance between the two coating layers. This allows detection of not only physical damage, but also the effects of the change of external environments, such as temperature or humidity, on the electric wire.

An electric wire inspection method using the electric wire inspection system contains: an initial data obtaining step in which the electric wire inspection of the electric wire is performed by the inspection unit at the first time point and the response signal is obtained; a data storage step in which the response signal obtained in the initial data obtaining step is stored in the storage unit; a measurement step in which the electric wire inspection of the electric wire at the second time point is performed by the inspection unit; and an analysis step in which the response signal obtained at the first time point is retrieved by the analysis unit from the storage unit and is compared with the response signal obtained in the measurement step at the second time point, and, if a difference exists between the two response signals, a region in which the difference exists in the response signals is correlated with a position along the axial direction of the electric wire.

In the electric wire inspection method described above, in the initial data obtaining step and the data storage step, at the first time point, a response signal obtained in electric wire inspection performed for the electric wire to be inspected is stored in the storage unit. Further, in the inspection step, electric wire inspection is performed for the electric wire at the second time point later than the first time point, and in the analysis step, the response signal corresponding to the first time point is retrieved from the storage unit, and a comparison is made between the response signal obtained at the first time point and the response signal obtained the second time point. If damage occurs to the electric wire between the first time point and the second time point, the characteristic impedance changes, and thus the damage can be detected by detecting the change in the response signals. In this case, even if signal components originating from the structure or characteristics of the electric wire appear in the response signal, damage on the electric wire can be detected without being affected by such signal components by performing a comparison of the response signal obtained at the first time point and the response signal obtained the second time point, whereby damage detection can be performed sensitively with high accuracy. Furthermore, by using time domain reflectometry or frequency domain reflectometry and correlating the position at which the characteristic impedance changes with a position of the electric wire along the axial direction, the position where damage is present along the axial direction of the electric wire can be easily identified with high accuracy.

A first electric wire according to an aspect of the present disclosure contains: a core wire containing a conductor and an insulation coating surrounding the conductor; and a conductive tape as detection tape arranged on an outer peripheral surface of the core wire, in which the conductive tape contains: a base material made of a tape-shaped insulator or a semiconductor; and a conductive layer made of a conductive material and formed on one surface of the base material, in which the conductive tape is wound around the core wire in a spiral shape without any gaps, and the conductive layer is not in contact with each other between adjacent turns of the spiral shape.

In the first electric wire, the conductive tape is wound around the core wire, and if the conductive tape is damaged, the characteristic impedance between the conductive tape and the conductor of the core wire changes. Therefore, by measuring the characteristic impedance between the conductive tape and the conductor of the core wire, it is possible to sensitively detect external damage formed on the electric wire. In this arrangement, the conductive tape is wound around the core wire without any gaps, so that external damage can be detected even if external damage is formed at any position in circumferential or axial direction of the electric wire. Furthermore, in a spiral shape of the conductive tape, the conductive layer is not in contact with each other between adjacent turns of the spiral shape, so that the occurrence of damage is sensitively reflected and can be detected as a change in characteristic impedance.

A second electric wire according to an aspect of the present disclosure contains: a core wire containing a conductor and an insulation coating surrounding the conductor; and a laminated tape as detection tape arranged on an outer peripheral surface of the core wire, in which the laminated tape contains: a base material made of a tape-shaped insulator or a semiconductor; and conductive coating layers formed on both surfaces of the base material, in which the laminated tape is wound around the core wire in a spiral shape without any gaps, and the coating layers are not in contact with each other between adjacent turns of the spiral shape.

In the second electric wire, when the laminated tape is damaged, the characteristic impedance between the two coating layers changes. Therefore, by measuring the change in characteristic impedance between the two coating layers, it is possible to sensitively detect damage formed on the electric wire. Instead of using a constituent member of the core wire, such as a conductor, measurement can be completed using the two coating layers of the laminated tape. Thus, by simple winding of a laminated tape, a damage detection function can be given to electric wires having various forms, such as a composite wire (wire harness) containing a plurality of insulated electric wires. If a material having an electrical characteristic that changes depending on external environment characteristics is used as the base material, the effect of change of the environment, such as temperature or humidity, on the electric wire can also be detected in addition to physical damage as change in characteristic impedance between the two coating layers. Since the laminated tape is wound around the core wire without any gaps, and also the coating layers are not in contact with each other between adjacent turns of the spiral shape, if external damage is formed, it can be sensitively detected regardless of the position where the external damage is formed.

In the first electric wire and the second electric wire, it is preferable that the core wire is a composite wire containing a plurality of insulated wires twisted together each comprising the conductor and the insulation coating surrounding the conductor, and the detection tape is spirally wound around the outer circumference of the entire composite wire. With this arrangement, the formation of any damage can be sensitively detected for the entire composite wire by the detection tape, namely, by the conductive tape or the laminated tape.

Here, it is preferable that the electric wire is configured as a composite wire for an electric brake having an external damage detection function, the insulated wires contain at least one of a power supply wire and a communication wire for an electric brake device of an automobile, and the detection tape is electrically connected to a measurement unit installed in the electric brake device. In a power supply wire or a communication wire of an electric brake device of an automobile, the consequences of damage are significant, and therefore, as a composite wire for an electric brake having an external damage detection function, the significance of using the electric wire according to an aspect of the present disclosure and sensitively detecting the formation of damage or a precursor thereof is great. In addition, by electrically connecting the detection tape that serves as the damage detection member to a measurement unit installed in the electric brake device, the formation of damage on the electric wire or a precursor of the formation of damage can be monitored at all times or frequently, so that the formation of damage or a precursor thereof can be detected at an early stage, allowing appropriate procession.

Details of Embodiments of Present Disclosure

Specific examples of an electric wire inspection system, an electric wire inspection method, and an electric wire according to the present disclosure will be described below with reference to the drawings. The electric wire inspection system according to an embodiment of the present disclosure is a system that enables inspection of damage (or a precursor of damage, which similarly applies in the present specification unless specifically stated otherwise) of an electric wire, and the electric wire inspection method according to an embodiment of the present disclosure can be performed using the electric wire inspection system. An example of the electric wire to which the electric wire inspection system and the electric wire inspection method can be preferably applied is the electric wire of the embodiment of the present disclosure. In the specification, terms used to indicate the shapes and the arrangement of the components of the electric wire, such as perpendicular, orthogonal, straight, and spiral, include not only geometrically strict concepts, but also error within the range allowed in the electric wire.

<Electric Wire to be Inspected>

First, the electric wire to be inspected in the electric wire inspection system and inspection method according to an embodiment of the present disclosure will be described. Similarly to a normal electric wire, the electric wire to be inspected includes a core wire including conductors and an insulation coating surrounding the conductors, and is also provided with a damage detection member. The damage detection member performs electric wire inspection by applying an electrical signal as an inspection signal and obtaining a response signal. In the electric wire inspection, the response signal obtained by the damage detection member changes depending on the damage state of the electric wire, that is to say depending on the presence or absence of damage to the electric wire, and more preferably, depending on the degree of damage and the position of damage.

The damage detection member is configured by two conductive members which are electrically insulated from each other. These two conductive members are composed of at least one of components of the core wire or components of the electric wire other than the core wire disposed along the core wire. The damage detection member can be classified into the following three configurations depending on the members constituting the damage detection member.

(i) Damage Detection Member Constituted by Only Components of Core Wire

The components of the core wire provide original functions of the electric wire, such as power supply, signal transmission, and noise shielding, and in this configuration, the components of the core wire also function as the damage detection member in addition to the original functions. For example, two conductive members such as conductors forming the core wire may be employed as the damage detection member. Specific examples include a configuration in which two conductors of the core wire are used as the damage detection member, such as in the case of the twisted pair wire (electric wire C) exemplified in the detailed description described later, and a configuration in which a central conductor and a shield conductor are used as the damage detection member, such as in the case of a coaxial shielded cable.

(ii) Damage Detection Member Constituted by Only Components Other than Core Wire In this case, a component of the core wire is not employed as the damage detection member. Instead, a component specialized for damage detection is provided in addition to the core wire and constitutes the electric wire together with the core wire. For example, it is conceivable a configuration in which a tape, a straight body, or the like containing a conductive member is arranged around the core wire and used as the damage detection member. One specific example is a configuration using a laminated tape-wound electric wire 3, which will be described later as a second electric wire according to an embodiment of the present disclosure. Specifically, the configuration in which a laminated tape having two conductive coating layers is wound around a core wire, and an electrical characteristic between the two conductive coating layers is evaluated.

(iii) Damage Detection Member Constituted by Component of Core Wire and Component Other than Core Wire In this case, the component of the core wire and the component provided in addition to the core wire cooperatively function as the damage detection member. For example, a conductive member of the core wire, such as a conductor, and another conductive member arranged around the core wire may constitute the damage detection member. One specific example is a configuration using conductive tape-wound electric wires 1 and 1', which will be described later as a first electric wire according to an embodiment of the present disclosure.

Specifically, the configuration in which a conductive tape is wound around a core wire, and an electrical characteristic between the conductive tape and the conductor of the core wire is evaluated.

In all of the above aspects (i) to (iii), the characteristic to be measured in electric wire inspection should be selected for allowing detection of various types of damage to the electric wire, such as disconnection, a short circuit, or external damage, in accordance with the specific configuration of the damage detection member. Examples of characteristics to be measured as a response signal using an electrical signal as an input signal include characteristic impedance or another characteristic that has a correlation with characteristic impedance, such as reflection coefficient, conductance, or capacitance. Such characteristics may be measured using a transmission technique, or may be measured using a reflection technique. The following describes a configuration in which an electrical signal that includes an AC component is applied as an inspection signal, and the characteristic impedance between the two conductive members constituting the damage detection member is obtained as a response signal, but unless stated otherwise in particular, a characteristic that correlates with the characteristic impedance can be used in electric wire inspection as a measurement object instead of the characteristic impedance.

In the following description of the electric wire inspection system and the electric wire inspection method, a twisted pair wire corresponding to the above-mentioned aspect (i) is used as an example of the electric wire to be inspected. In a twisted pair wire, two insulated electric wires are twisted together to form a core wire. The following describes a configuration in which an electrical signal that includes an AC component is input, as an inspection signal, to the conductors constituting the two insulated wires, and the characteristic impedance between the two conductors is detected as a response signal using reflectometry. If damage such as a short circuit between two conductors occurs in a twisted pair wire, the characteristic impedance between the two conductors changes.

There are no particular limitations with respect to the application and location of the electric wire to be inspected with the inspection system and inspection method according to an embodiment of the present disclosure. Examples of the electric wire to be inspected include an electric wire installed in any of various electrical and electronic devices or transportation devices such as automobiles and aircraft, an electric wire routed inside a structure such as a house or a building, or an electric wire of a public utility such as a power transmission line. Note that the inspection system and inspection method described below can sensitively detect damage or a precursor of damage to an electric wire, and therefore the electric wire to be inspected is preferably an electric wire greatly influenced by damage, such as an electric wire arranged in an automobile. The following description will be made assuming that the electric wire is to be installed in an automobile.

<Electric Wire Inspection System>

Next, an electric wire inspection system according to an embodiment of the present disclosure will be described.

FIG. 1 schematically illustrates an electric wire inspection system A. The electric wire inspection system A contains an inspection unit A1, a storage unit A2, and an analysis unit A3. The inspection unit A1 is configured as a measuring device which performs electric wire inspection of an individual electric wire C', that is to say a measuring device for inputting an inspection signal to the electric wire C' and obtaining a response signal. In the aspect described here, the inspection unit A1 is configured as a measuring device that can input an electrical signal that includes an AC component as an inspection signal to two conductive members constituting the damage detection member of the electric wire C', and obtain a characteristic impedance as a response signal using reflectometry. More specifically, the inspection unit A1 obtains the characteristic impedance by time domain reflectometry or frequency domain reflectometry, and these methods will be described in detail later.

The storage unit A2 is a device that can store data, and suitable examples include a memory device such as an internal storage device integrated with the inspection unit A1 or an external storage device that can be connected to the inspection unit A1.

Alternatively, the storage unit A2 can be configured as an information management server that can communicate with the inspection unit A1 and/or the analysis unit A3 through wired or wireless communication, such as a cloud server.

The analysis unit A3 is a device that can retrieve data from the storage unit A2 and perform a comparison between the retrieved data and data obtained by the inspection unit A1. The analysis unit A3 may be a CPU integrated with the inspection unit A1, or a computer or the like provided near the inspection unit A1 and capable of receiving data from the inspection unit A1 and the storage unit A2 by wire or wirelessly. It is preferable that the inspection unit A1, the storage unit A2, and the analysis unit A3 are all provided near the electric wire C' to be inspected. In particular, it is preferable to keep the inspection unit A1 connected to the conductive members constituting the damage detection member of the electric wire C', so that the electric wire inspection can be performed at all times by inputting an inspection signal and obtaining a response signal. It is preferable that the storage unit A2 and the analysis unit A3 are provided as built-in or auxiliary devices of the inspection unit A1, and are kept at all times in a state where a response signal can be input from the inspection unit A1 to the storage unit A2 and the analysis unit A3, the received data can be stored in the storage unit A2, and data can be analyzed by the analysis unit A3. For example, the inspection unit A1 is stay connected at all times to the damage detection member of the electric wire C' installed in an automobile, the storage unit A2 is configured as an internal storage device of the inspection unit A1, and the analysis unit A3 is configured as a CPU auxiliary provided to the inspection unit A1. More specific example of the electric wire inspection system A includes an inspection system for a composite wire for an electric brake having a damage detection function. In this case, the core wire of the electric wire C' constitutes a power supply wire or a communication wire of an electric brake device of the automobile, and the damage detection member is electrically connected to a measurement unit auxiliary provided to the electric brake device. It is preferable that a measuring device that integrally has the functions of the inspection unit A1, the storage unit A2, and the analysis unit A3 is used as the measuring unit.

In the electric wire inspection system A according to the present embodiment, the inspection unit A1 performs electric wire inspection of the electric wire C' at a first time point. In the illustrated example, the electric wire C' is assumed to be formed as a twisted pair wire, and the inspection unit A1 measures, as the electric wire inspection, a characteristic impedance using time domain reflectometry. The storage unit A2 stores the response signal obtained by the inspection unit A1 at the first time point. Here, the first time point refers to, for example, an initial state of the electric wire C' for the period between after its manufacturing and before its usage.

At a second time point after the first time point, the inspection unit A1 performs electric wire inspection again for the electric wire C' that was subjected to electric wire inspection at the first time point. For example, after the start of usage of the automobile equipped with the electric wire C', electric wire inspection is performed continuously at all times, or electric wire inspection is performed periodically at a predetermined interval, and the second time point is any of the times at which such electric wire inspection is performed. The electric wire inspection at the second point is performed similarly to the above-described inspection performed at the first time point.

The analysis unit A3 can read a response signal obtained by the storage unit A2, from the inspection unit A1. Furthermore, the analysis unit A3 can communicate with the storage unit A2 and retrieve a response signal stored in the storage unit A2. When the inspection unit A1 performs electric wire inspection at the second time point, the analysis unit A3 reads a response signal $c_2$ obtained through the electric wire inspection, and also retrieves a response signal $c_1$ obtained through the electric wire inspection performed at the first time point from the storage unit A2.

Furthermore, for the electric wire C' to be inspected, the analysis unit A3 compares the response signal $c_2$ obtained by the inspection unit A1 at the second time point with the response signal $c_1$ obtained at the first time point and retrieved from the storage unit A2. Then, it is determined whether a difference exists between the two response signals $c_1$ and $c_2$. If a difference is equal to or more than a predetermined value, it is determined that damage which was not present at the first time point is present in the electric wire C' at the second time point. When comparing the response signals, it is preferable that the analysis unit A3 calculates subtraction between the response signal $c_2$ obtained at the second time point and the response signal $c_1$ obtained at the first time point, and determine, based on the calculated subtraction, whether or not a difference exists between the response signals. In other words, it is preferable to determine that damage is present if subtraction exhibits an intensity greater than a predetermined threshold value in either the positive or negative direction. Furthermore, in the present embodiment, since the inspection unit A1 measures the characteristic impedance by time domain reflectometry or frequency domain reflectometry, the analysis unit A3 can analyze the results of comparison between the response signals in further detail and identify the location where damage is present. Through detailed analysis, it may also be possible to further specify the type of damage. A method for analysis based on subtraction and a method for identifying a damage position will be described later along with specific examples.

<Electric Wire Inspection Method>

Figure 2:
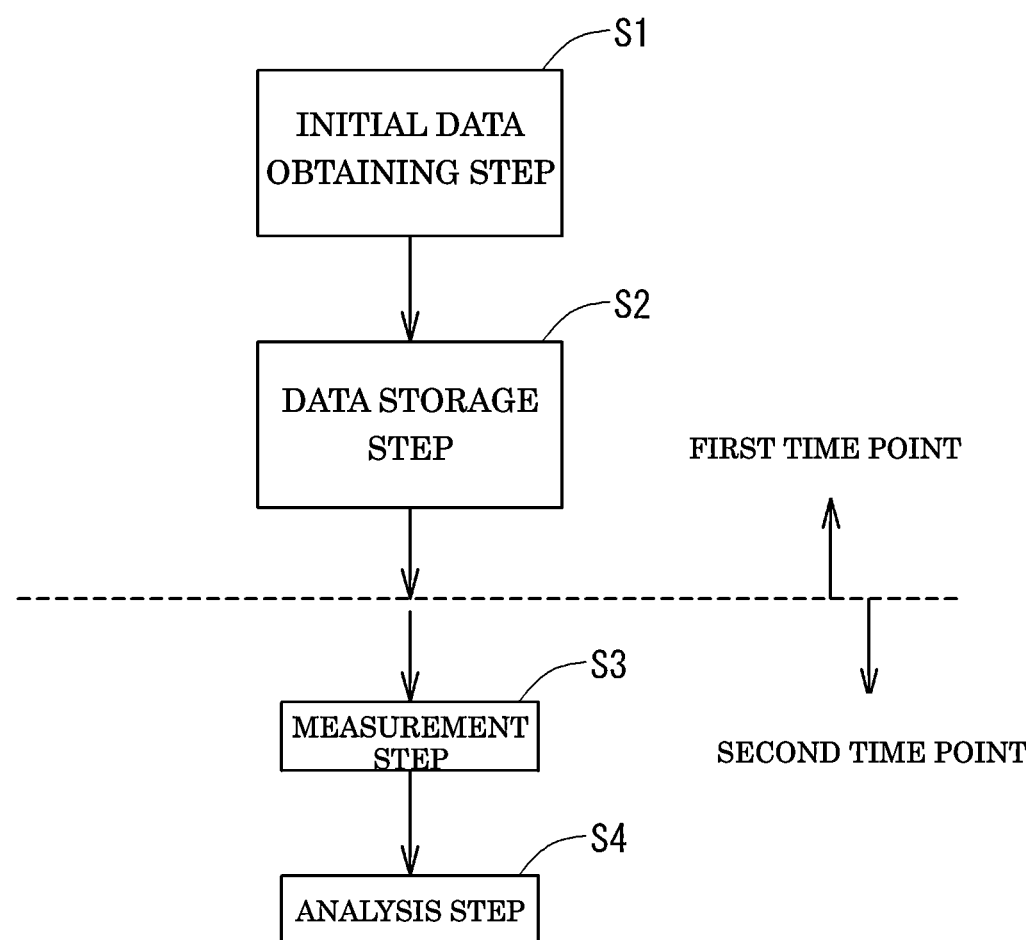
FIG. 2 is a flowchart illustrating an electric wire inspection method according to one embodiment of the present disclosure.

Next, an electric wire inspection method according to an embodiment of the present disclosure, which uses the electric wire inspection system A described above, will be briefly described. FIG. 2 shows a flowchart of the electric wire inspection method.

In the electric wire inspection method, at a first time point, an initial data obtaining step S1 and a data storage step S2 are performed. Furthermore, at a second time point, a measurement step S3 and an analysis step S4 are performed. The first time point indicates, for example, an initial state of the automobile equipped with the electric wire C' before its operation. Meanwhile, the second time point refers to, for example, the time of inspection of the automobile equipped with the electric wire C' upon its operation.

In the initial data obtaining step S1, at the first time point, electric wire inspection is performed by the inspection unit A1. In other words, an inspection signal is input to the electric wire C', and a response signal c1 is obtained. In the example shown in FIG. 1, a characteristic impedance between conductors is measured for the electric wire C' configured as a twisted pair wire. In the data storage step S2, a response signal c1 (the measurement result of characteristic impedance) obtained in the initial data obtaining step S1 is stored in the storage unit A2.

Then, when a predetermined period of time has elapsed and the second time point, which is a time for inspection of the electric wire C', arrives, the measurement step S3 is performed. Specifically, the inspection unit A1 performs electric wire inspection of the electric wire C' to be inspected, and obtains a response signal c2. In the example shown in FIG. 1, as the measurement step S3, similarly to the initial data obtaining step S1, the characteristic impedance of the electric wire C' configured as a twisted pair wire is measured, and the measurement result is obtained as the response signal c2.

When the measurement step S3 is complete, the analysis step S4 is performed. In the analysis step S4, the analysis unit A3 reads the response signal c1 obtained at the first time point and stored in the storage unit A2. In the analysis step S4, the analysis unit A3 compares the response signal c2 obtained by the inspection unit A1 at the second time point with the response signal c1 at the first time point retrieved from the storage unit A2. Then, after suitably obtaining the subtraction between the two response signals c1 and c2, it is determined whether or not a difference exists between the two response signals c1 and c2. If the difference between the two response signals c1 and c2 is greater than or equal to a predetermined level, that is to say if the difference is greater than or equal to a margin of error or a negligible level, it is determined that damage that was not present at the first time point is present in the electric wire C' by the second time point. On the other hand, if the difference between the two response signals c1 and c2 is not greater than or equal to the predetermined level, it is determined that no problematic damage is present in the electric wire C'. Also, the analysis unit A3 analyzes the results of comparison between the response signals c1 and c2 in more detail, and specifies the position where the damage is present. Further, the type of damage is also identified depending on the type of the electric wire, if possible.

In the above description, a response signal is stored in the storage unit A2 at the first time point, which is an initial state in which the automobile equipped with the electric wire C' is not in use, and electric wire inspection is performed at the second time point, which is an inspection time after the start of usage of the automobile equipped with the electric wire C'. Herein, it is preferable that electric wire inspection is performed multiple times after the start of usage of the automobile equipped with the electric wire C'. Furthermore, it is preferable that the inspection unit A1 is kept connected to the electric wire C' to be inspected, allowing repetitive performance of electric wire inspection at all times by continuously inputting the inspection signal and obtaining the response signal, or that electric wire inspection is automatically performed at a predetermined time interval or each time the apparatus equipped with the electric wire C' performs a predetermined operation (e.g., if the electric wire C' is included in an automobile electric brake device, each time the brake is operated). In these cases, the second time point is each of such time points at which electric wire inspection is performed.

Thus, in the case where electric wire inspection is performed multiple times, the response signal at the first time point which is stored in the storage unit A2 and used in the analysis step, may not change from the response signal obtained at the initial state of the electric wire C' before its usage, or may be updated as electric wire inspection is performed repeatedly. Specifically, in the case where electric wire inspection is repeatedly performed at all times, or is repeatedly performed at a predetermined time interval or each time the apparatus performs a predetermined operation, it is preferable that a response signal $(c_{n-1})$ obtained in the measurement step of the previous electric wire inspection is newly stored in the storage unit A2 as the response signal obtained at the first time point, a response signal $(c_n)$ newly obtained in the measurement step of the next electric wire inspection is treated as the response signal obtained at the second time point, and the two response signals $(c_{n-1}$ and $c_n)$ are compared with each other in the analysis step. Then, the newly obtained response signal $(c_n)$ is stored in the storage unit A2 again as the new response signal at the first time point, a response signal $(c_{n+1})$ obtained in the measurement step of the subsequent electric wire inspection is treated as the response signal obtained at the second time point, and the two response signals $(c_n$ and $c_{n+1})$ are compared for analysis. By repeating the process multiple times, any change that occurs in the response signal over time can be detected sensitively. Also, rather than being limited to one response signal, multiple response signals may be stored in the storage unit A2 as data at the first time point. That is to say, the response signals obtained by multiple times of electric wire inspection can be stored into the storage unit A2 as well as one response signal obtained by one time of electric wire inspection. From the response signals obtained by multiple times of electric wire inspection, a response signal may be used in the analysis step as the response signal at the first time point which is selected based on a time interval from the electric wire inspection at the second time point, or the average of the multiple response signals may be used in the analysis step as the response signal at the first point, for example.

In the electric wire inspection system and electric wire inspection method according to the present embodiment, it is assumed that an electrical characteristic such as characteristic impedance is measured in the time domain or the frequency domain using an electrical signal containing an AC component. Therefore, if damage is present in an electric wire, the position of the damage along the axial direction of the electric wire can be identified in addition to detecting the presence of damage. This is because with respect to response signals measured in the time domain or the frequency domain, if a difference exists between the first time point and the second time point, the region in the response signal where the difference exists can be associated with a position along the axial direction of the electric wire. That is to say, if a difference exists between two response signals, it can be determined that damage is present in the electric wire, and furthermore, by associating the regions in the response signals where the difference exists with a position along the axial direction of the electric wire, it can be determined that damage is present at the position. In the time domain measurement, the time axis can be converted into a position on the electric wire based on the propagation speed of the inspection signal. Meanwhile, in the frequency domain measurement, information on frequency can be converted into a position on the electric wire by performing inverse Fourier transform on the inspection signal obtained for the frequency axis.

When the measurement is made in the time domain or the frequency domain, the damage position can be identified regardless of whether the measurement is made by the transmission method or reflectometry; however, it is especially preferable to perform the measurement by reflectometry. When performing the measurement by reflectometry, it is sufficient that the measuring device is connected to only one end of the electric wire, and thus electric wire inspection can be performed without connecting the measuring device to both ends of the electric wire. Therefore, even if the electric wire is arranged at a position that is not easily accessible, such as inside a vehicle, or if the electric wire is arranged along a complicated route, as long as the measuring device can be connected to one end of the electric wire, electric wire inspection can be performed without removal of the electric wire or obstacles. Therefore, this is suitable for a configuration in which the measuring device is connected to the electric wire to be inspected at all times to perform continuous or frequent electric wire inspection. Hereunder, in the description of a conductive tape-wound electric wire as an electric wire according to the first embodiment of the present disclosure, a detailed description will be given for the measurement of characteristic impedance using time domain reflectometry and frequency domain reflectometry.

<Variation in Response Signals and Change Due to Damage>

Figure 3:
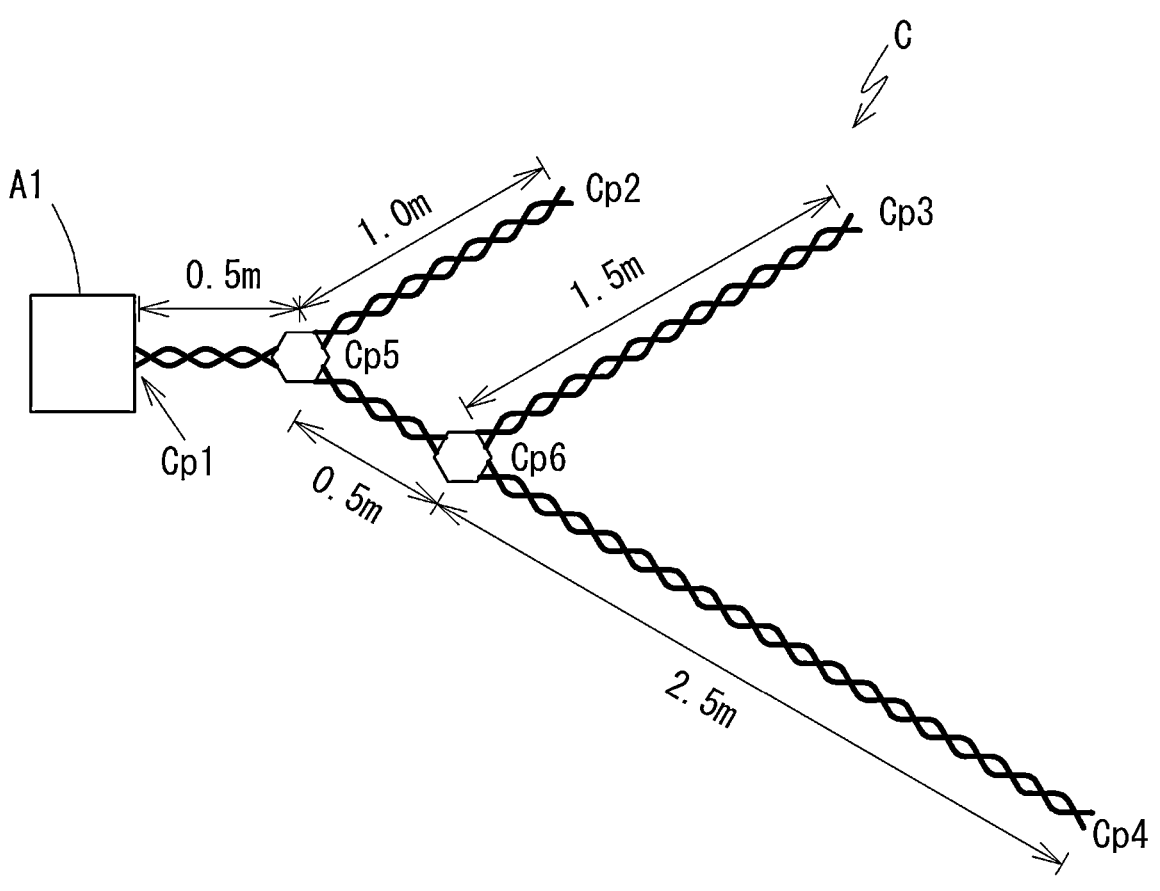
FIG. 3 is a diagram showing an example of an electric wire to be inspected.

Next, variation in response signals between electric wires and change in response signals due to damage will be described. The following describes the measurement of characteristic impedance of the electric wire C by time domain reflectometry which is configured as a twisted pair wire and is provided with branched portions at two locations (at Cp5 and at Cp6) as shown in FIG. 3, referring to examples of actual measurement results. The measurement examples were measured by multicarrier time domain reflectometry (MCTDR), which is one of various time domain reflectometry techniques and will be described later.

FIG. 4A shows the characteristic impedance measured by the measuring device (inspection unit) A1 connected to a base end Cp1 of the electric wire C having no damage. In FIG. 4A and later-described FIGS. 4B to 4E, the time axis converted to distance (unit: m) from the base end Cp1 is shown in the horizontal axis, and the characteristic impedance is shown in the vertical axis. The characteristic impedance in the vertical axis indicates the amount of change by setting a value at the shortest distance as zero. The measurement results in FIG. 4A show large waves even though no damage is present at the electric wire C. The wavy structure is mainly due to reflections at the two branched portions Cp5 and Cp6.

FIG. 4B shows the measurement results of characteristic impedance in the case where a short circuit is formed between two conductors at one end Cp2 of the electric wire C, as a damage model. A change in the waveform can be seen compared with the measurement results in FIG. 4A, and the change is due to the formation of the short circuit at the end Cp2. FIG. 4C shows a subtraction waveform obtained by subtracting the waveform before damage formation in FIG. 4A from the waveform after damage formation in FIG. 4B. In the subtraction waveform, a large negative peak structure can be seen near a point at a distance of 1.5 m. This peak structure can be correlated with change caused by damage formation. In fact, the end Cp2 where the short circuit was formed as damage is 1.5 m away from the base end Cp1, and corresponds to the position where the peak was observed through subtraction.

Next, the measurement results are shown of characteristic impedance similarly measured for the same type of electric wire (referred to as electric wire 2) as the electric wire subjected to the measurement in FIG. 4A (referred to as electric wire 1), that is to say another electric wire manufactured in the same way and based on the same design of the electric wire 1. FIG. 4D shows the measurement results of the characteristic impedance for both the electric wire 1 and the electric wire 2. By comparing the waveforms of the electric wires 1 and 2, it can be seen that although the tendencies of increase and decrease of signal strength in waviness are similar, the details of the signal waveforms, such as the positions and sizes of peaks and valleys, are different between the two waveforms.

FIG. 4E shows the subtraction between the waveform of the electric wire 1 and the waveform of the electric wire 2 in FIG. 4D. The subtraction signal shown in FIG. 4E exhibits a large wavy structure. In the wavy structure, a negative peak structure similar to that observed near a distance of 1.5 m in FIG. 4C can be seen near a distance of 2 m. Thus, it can be said that the subtraction between the measurement results obtained for two undamaged electric wires of the same type exhibits a similar peak structure in shape and intensity as the subtraction between the measurement result obtained when damage is present and the measurement result obtained when damage is absence for the same electric wire.

This means that when damage is detected for an electric wire based on the measurement results of characteristic impedance, detection cannot be performed correctly unless comparison is made for the electric wire to be inspected between the measurement result with the state of having damage and the measurement result with the state of having no damage. In the electric wire inspection system and electric wire inspection method according to the embodiment of the present disclosure described above, at the first time point, the response signal c1 obtained for the electric wire C' to be inspected is stored in the storage unit A2, and then at a second time point, electric wire inspection is performed for the electric wire C' to be inspected and the response signal c2 is obtained and compared with the response signal c1 of the electric wire C' at the first time point, which is retrieved from the storage unit A2. Thus, by using the response signal obtained previously at the first time point for the electric wire to be inspected, instead of using a standard response signal (i.e., a response signal representatively obtained for an electric wire as a standard sample) provided by the manufacturers of electric wires or automobiles, as the response signal that is regarded as normal and used for comparison, even if signal behavior originating from the structure or characteristics of the electric wire appear in the response signal, such as variations in the response signals between electric wires as shown in FIG. 4D, the presence or absence of damage on the actual electric wire to be inspected can be detected with high sensitivity without being affected by such signal behavior, and furthermore the damage position of the wire can be identified.

In particular, if an electric wire has an element that is discontinuous with its surroundings such as a branched portion like the electric wire C illustrated in FIG. 3, it is frequent that electrical signal reflection occurs at the position where the discontinuous element is formed, and large signal component originating from the discontinuous element appears in the response signal and exhibits a similar behavior with the one of a damaged portion. In such cases, if the damage is slight, in a response signal, the structure such as peaks originating from the damage may be buried in the structure originating from discontinuous elements such as branches, and thus a difficulty arises in distinguishing the structures. For these cases, it is particularly effective for damage detection to store a response signal of the electric wire to be inspected obtained at a first point and compare it with a response signal obtained at a second time point. Furthermore, detection accuracy can be further improved by using a subtraction detection method that calculates the subtraction between the response signal obtained at the first time point and the response signal obtained at the second time point. By calculating the subtraction, it may be possible to at least partially cancel out the influence of discontinuous elements such as branches in the response signal, whereby the structure of the response signal originating from damage can be emphasized.

Specific Example of the Configuration Electric Wire

The following describes specific examples of an electric wire provided with detection tape, which can be suitably applied for inspection by the electric wire inspection system and the electric wire inspection method described above. The following specifically describes two types of electric wires, namely conductive tape-wound electric wires 1 and 1' as an electric wire according to a first embodiment of the present disclosure, and a laminated tape-wound electric wire 3 as an electric wire according to a second embodiment of the present disclosure. The conductive tape-wound electric wires 1 and 1' contain conductive tape as the detection tape, and the laminated tape-wound electric wire 3 contains laminated tape as the detection tape. Damage to these electric wires can also be detected by other methods than using the electric wire inspection system and the electric wire inspection method according to the present disclosure. For example, instead of comparing the response signals obtained at a first time point and a second time point, detection can be made, for instance, by obtaining a response signal at one point, detecting a region in which the value of characteristic impedance changes discontinuously from the ones in the surrounding regions, and correlating the detected region with damage.

[1] Conductive Tape-Wound Electric Wire

First, the conductive tape-wound electric wires 1 and 1' will be described as an electric wire according to the first embodiment. First, the following describes in detail the configuration of the conductive tape-wound electric wire 1 according to a first example and an electric wire inspection method for the same, and then the conductive tape-wound electric wire 1' according to a second example will be described focusing mainly on differences from the first example.

Configuration of Conductive Tape-Wound Electric Wire of First Example

Figure 5:
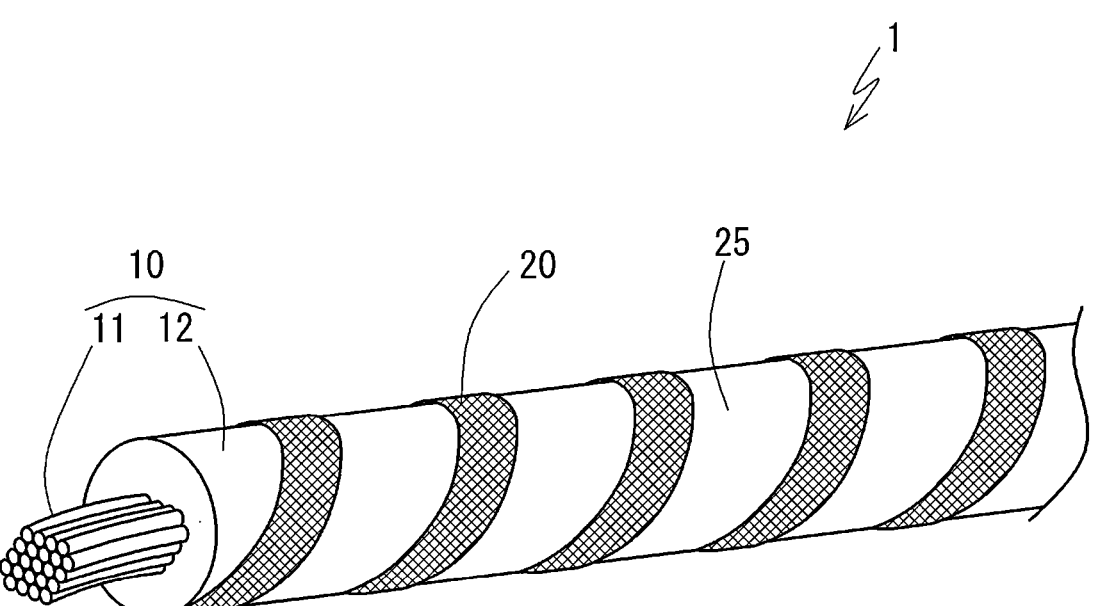
FIG. 5 is a perspective view illustrating the configuration of a first example of a conductive tape-wound electric wire as an electric wire according to a first embodiment of the present disclosure.
Figure 6A:
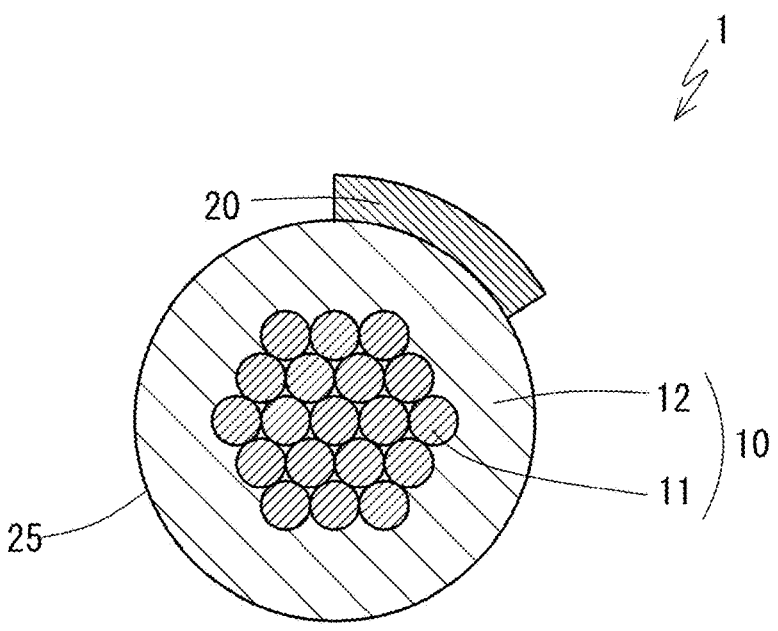
FIGS. 6A and 6B are cross-sectional views each showing the cross-section of the conductive tape-wound electric wire in FIG. 5, taken perpendicular to the axial direction, where

FIG. 5 illustrates a perspective view of the conductive tape-wound electric wire 1 as a first example of an electric wire according to the first embodiment of the present disclosure. FIG. 6A illustrates an example of cross-section of the conductive tape-wound electric wire 1 taken perpendicularly to the axial direction.

The conductive tape-wound electric wire (hereinafter sometimes simply referred to as the electric wire) 1 contains a core wire 10 and a conductive tape 20 wound around the core wire 10. The core wire 10 is a member that serves as the main body of the electric wire 1, and plays a role of transmitting current and voltage and/or transmitting signals between the two terminal ends. Concurrently, the core wire 10 and the conductive tape 20 function as the damage detection member in the configuration (iii) described above, detecting damage D formed on the surface of the electric wire 1 when the conductive tape 20 is damaged.

The core wire 10 contains a conductor 11 made of elongated conductive members, and an insulation coating 12 made of an insulating material that surrounds the conductor 11. It is preferable that the insulation coating 12 is exposed on the entire surface of the core wire 10 and constitutes the outer peripheral surface of the core wire 10. In the illustrated configuration, the core wire 10 has a single-wire structure including only one insulated wire in which the insulation coating 12 surrounds the conductor 11. The conductive tape 20 is placed directly on the surface of the insulation coating 12 that directly covers the outer peripheral surface of the conductor 11.

Figure 8:
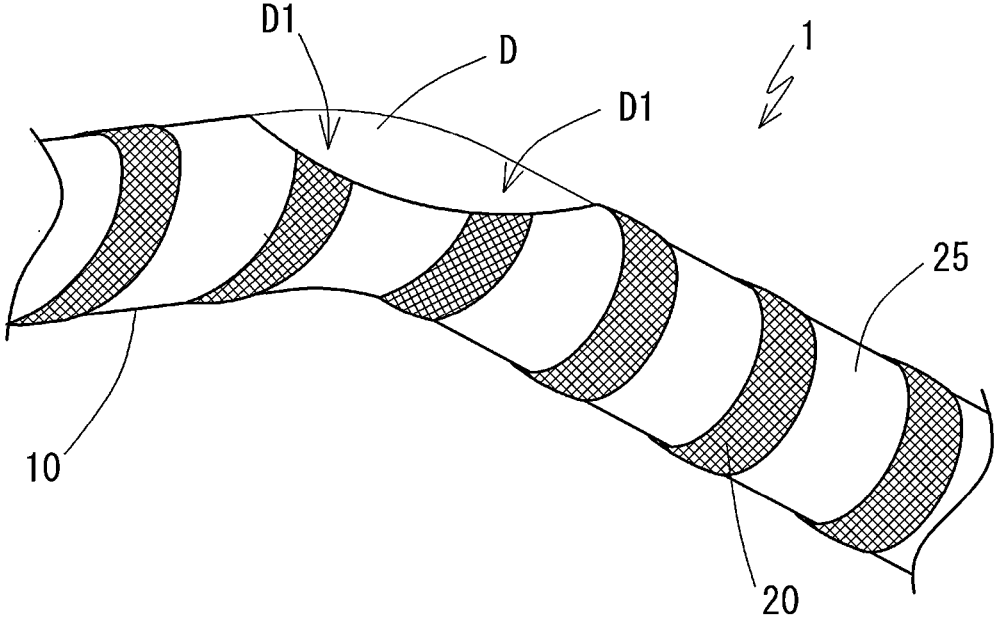
FIG. 8 is a perspective view of the conductive tape-wound electric wire in FIG. 5 with a state where the wire is bent and damage is present at the outer part of the bent portion.
Figure 9:
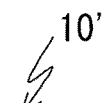
FIG. 9 is a side view of a core wire having branches.
Figure 9:
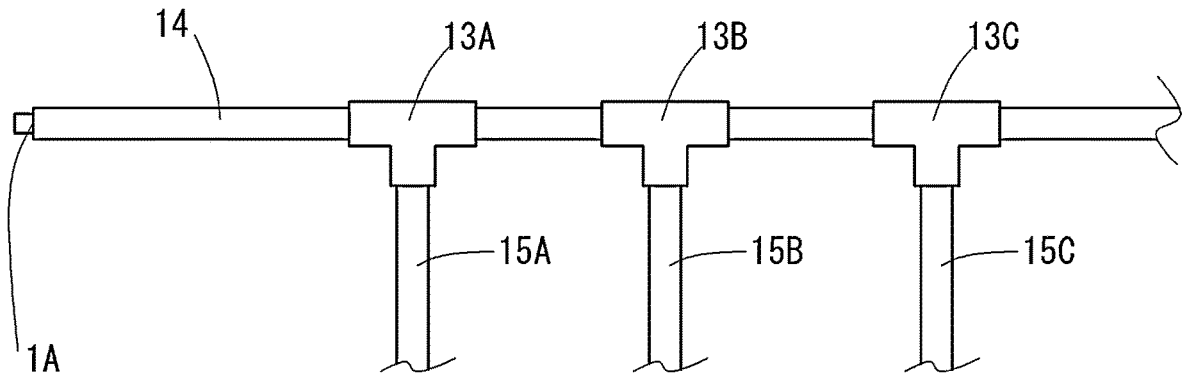
Figure 10:
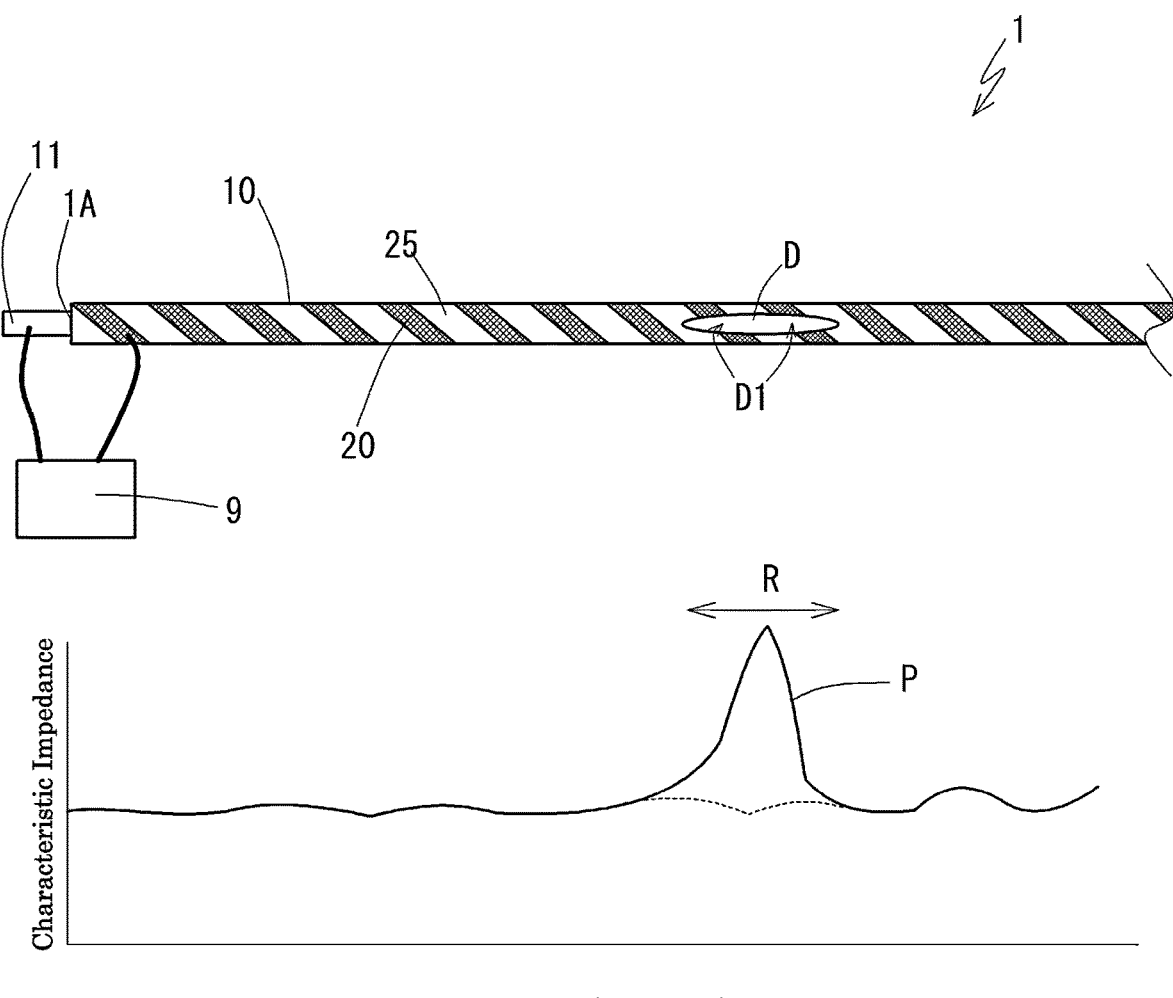
FIG. 10 is a schematic diagram explaining inspection performed for the conductive tape-wound electric wire.

The structure of the core wire 10 is not limited to the single-wire structure as described above, and may be any structure as long as the core wire 10 contains the conductor 11 and the insulation coating 12 that surround the conductor 11 and is preferably exposed on the surface. An existing electric wire can also be used as the core wire 10 without modification. In the core wire 10, the insulation coating 12 may directly cover the outer peripheral surface of the conductor 11, or may cover the outer peripheral surface of the conductor 11 by interposing another member between the conductor 11 and the insulation coating 12. Furthermore, no particular limitations are interposed on the number of conductors 11 or the arrangement thereof. Examples of configurations of the core wire 10 other than a single-wire structure include a shielded cable in which an insulated wire is covered by a shield conductor that is further covered by the insulation coating 12, a pair cable in which a parallel pair wire composed of a pair of insulated electric wires arranged in parallel with one another or a twist pair cable in which a pair of insulated electric wires are twisted together is covered by the insulation coating 12 as the exterior member, and a composite wire (wire harness) containing a multiple insulated wires. An example of a composite wire containing multiple coated wires includes a composite twisted wire obtained by twisting multiple insulated wires such as power supply wires and communication wires together (see FIG. 12). However, as will be described in detail later, it is preferable that the core wire 10 has the structure of being susceptible to the influence of external noise rather than the structure enabling measurement of the characteristic impedance between components of the core wire 10 such as a single-wire structure in view of the relatively high significance of detecting the damage D by the conductive tape 20. On the other hand, it is preferable that the core wire 10 contains multiple insulated wires from the viewpoint that detection of the damage D can be performed for the entire assembly of the insulated wires. The core wire 10 may be a single straight wire, as illustrated in FIGS. 5, 8, and 10, or may have branch portions (13A to 13C) at intermediate points, as illustrated in FIG. 9.

The conductive tape 20 is formed as a tape having conductivity. The conductive tape 20 is wound around the core wire 10 to have a spiral shape along the axial direction of the core wire 10 with contacting the surface of the insulation coating 12 of the core wire 10. In the electric wire 1 according to the first example, the conductive tape 20 is not wound tightly or overlapped in a spiral shape without space left between adjacent turns of the tape 20, but rather the conductive tape 20 is coarsely wound with a gap 25 that is not occupied by the conductive tape 20 left between adjacent turns of the tape 20. In the gaps 25 between turns, the insulation coating 12 of the core wire 10 is not covered by the conductive tape 20, and is exposed. With respect to the form of the conductive tape 20, the tape is a sheet-shaped member that can be distinguished from a wire-like body such as a metal wire, and has a thickness smaller than the width. Further, the conductive tape 20 is wound such that the tape 20 is partly not in direct contact with each other at adjacent turns of the spiral shape due to the presence of the gaps 25, and further via another conductive member. Therefore, other conductive members such as a metal braid cannot be provided on the outer peripheral surface of the conductive tape 20.

The conductive tape 20 may be in in the form of a conductive foil entirely made of conductive material such as metallic material (a single-layer conductive tape), or may be formed such that a conductive layer made of a conductive material such as a metallic material is formed on the surface of a base material composed of a tape-like insulator or semiconductor. The conductive layer may be formed on only one surface of the base material (a single-sided conductive tape) or on both surfaces of the base material (a double-sided conductive tape). When using single-sided conductive tape, the conductive tape may be wound around the core wire 10 with the conductive layer facing either inward or outward. If the conductive layer is formed such that it face the opposite side form the side in contact with the core wire 10 (i.e., the outer side of the electric wire 1), it shows excellent sensitivity in damage detection. In contrast, if the conductive layer is formed such that it faces the core wire 10 (i.e., the inner side of the electric wire 1), it shows easiness in keeping conductivity with an inner member of the conductive tape such as a drain wire. Meanwhile, when using double-sided conductive tape, in contrast with the laminated tape 40 described later, the two conductive layers may be insulated from each other or electrically conductive with each other.

Regardless of whether the conductive tape is single-layer conductive tape, single-sided conductive tape, or double-sided conductive tape, there are no particular limitations on the type of conductive material of the conductive tape 20; however, examples of the conductive material include copper or a copper alloy, and aluminum or an aluminum alloy from the viewpoint of its excellent conductivity and strength. However, severe oxidation of the metal material prevent accurate detection of external damage using the conductivity of the conductive tape 20 as part of the detection principle, and therefore it is preferable to not use iron or an iron alloy as the metal material of the conductive tape

20. There are also no particular limitations on the type of base material constituting the single-sided conductive tape or the double-sided conductive tape, but a tape made of an insulator such as an organic polymer material can be suitably used. The conductive tape 20 may be fixed to the surface of the core wire 10 by adhesion or fusion.

The thickness of the conductive tape 20 is also not particularly limited, but the thinner the tape is, the greater the sensitivity in detecting damage on the electric wire 1 is. Specifically, it is preferable that the conductive tape 20 should be thin enough that external damage D expected in the electric wire 1 causes disconnection, or thin enough that even if no disconnection occurs, a deep and large damage D is formed enough to cause capacitance changes between the conductive tape 20 and the conductor 11. On the other hand, it is preferable that the conductive tape 20 is thick enough to have sufficient strength for preventing problems when wound in a spiral shape.

There is no particular limitation on the pitch of the spiral shape of the conductive tape 20 wound around the core wire 10 and the ratio of the width of the conductive tape 20 to the width of the gaps 25. However, as shown in FIG. 6A, it is preferable that the conductive tape 20 is wound sufficiently coarsely so that the core wire 10 is not completely covered by the conductive tape 20 but is only partly covered in the circumferential direction, when viewed in a cross-section taken perpendicularly to the axial direction of the electric wire 1. That is to say, the conductive tape 20 should be wound at a sufficiently large pitch with keeping the width of the gaps 25 relative to the width of the conductive tape 20 large. With respect to the entire length of the core wire 10, the percentage of the region that is not covered by the conductive tape 20 and is exposed as the gaps 25 is preferably 50% or more, and more preferably 75% or more. On the other hand, the pitch of the spiral should be small enough that the external damage D expected in the electric wire 1 occupies a region corresponding to at least one pitch of the spiral along the axial direction of the electric wire 1, as shown in FIGS. 8 and 10. This arrangement increases a possibility that the external damage D overlaps the region where the conductive tape 20 is provided, even if the external damage D is formed at various positions in the axial direction or the circumferential direction of the electric wire 1. For example, in the case of routing the electric wire 1 with the wire 1 being bent as shown in FIG. 8, the pitch of the spiral should be set to be ⅓ or smaller of the allowable bending radius of the electric wire 1.

The conductive tape 20 is preferably exposed on the outer surface of the electric wire 1 as a whole without being covered by other members. With this arrangement, damage D1 is likely to be formed on the conductive tape 20 when the electric wire 1 is in contact with other objects or causes friction with other objects, increasing sensitivity in damage detection. Meanwhile, if the conductive tape 20 is formed as a thin layer that is easily damaged by contact or friction with other objects, a layer composed of an organic polymer or the like may cover the conductive tape 20.

In the electric wire 1, the conductive tape 20 may be provided over the entire area or only in partial areas along the axial direction of the core wire 10. The entire area arrangement of the conductive tape 20 is preferable in that the external damage D can be detected at any location along the axial direction of the electric wire 1. Whereas, the partial areas arrangement of the conductive tape 20 is preferable in that an increase of the manufacturing cost and a mass of the electric wire 1 that is caused by employment of the conductive tape 20 can be suppressed. In the partial areas arrangement of the conductive tape 20, it is preferable to wind the conductive tape 20 so as to cover a portion at which the external damage D is likely to occur due to contact or friction with other members, such as a portion at which the core wire 10 is to be bent. As illustrated in FIG. 9, when the core wire 10 has the branched portions 13A to 13C at intermediate positions, if an area exists at which the external damage D is likely to occur at the end side apart from the branched portions 13A to 13C (when the side in which a measurement device 9, which will be described below, is connected is defined as the base end 1A, the end side means the opposite side thereof), it is preferable that the conductive tape 20 is provided so as to cover an area from the branched portion(s) to the end side portion.

There are no limitations on the application of the electric wire 1, and it can be routed in any equipment, such as a vehicle, or be provided in any building. However, it is preferable that the electric wire 1 is used in a floating state, with the conductive tape 20 not electrically connected to the earth potential (ground potential). This is because if the conductive tape 20 is used in a floating state, the electrical connection between the conductor 11 and the ground potential less likely to affect the detection of external damage D using the conductive tape 20 such as when a switch is installed between the core wire 10 and the ground potential for on/off control.

(Electric Wire Inspection Method)

The following describes electric wire inspection performed on the conductive tape-wound electric wire 1. In electric wire inspection, damage D1 on the conductive tape 20 is directly detected. In addition, the electric wire inspection aims to detect the presence of external damage D in the insulation coating 12 of the core wire 10, or a precursor of formation of the external damage D in the insulation coating 12, using the damage D1 on the conductive tape 20 as an indicator.

In the electric wire inspection, the characteristic impedance between the conductor 11 and the conductive tape 20 is measured. Then, the characteristic impedances obtained as the response signals at the first time point and the second time point are compared with each other, and the presence or absence of the external damage D in the electric wire 1 at the second time point is determined. More preferably, the position where the external damage D is formed along the axial direction of the electric wire 1 is also identified.

As illustrated in FIG. 10, in electric wire inspection, the measuring device 9 (corresponding to the inspection unit A1) is appropriately connected to the base end 1A of the electric wire 1, and the characteristic impedance between the conductive tape 20 and the conductor 11 of the core wire 10 is measured. It is preferable that the measurement of the characteristic impedance is performed by time domain reflectometry (TDR) or frequency domain reflectometry (FDR).

Figure 6B:
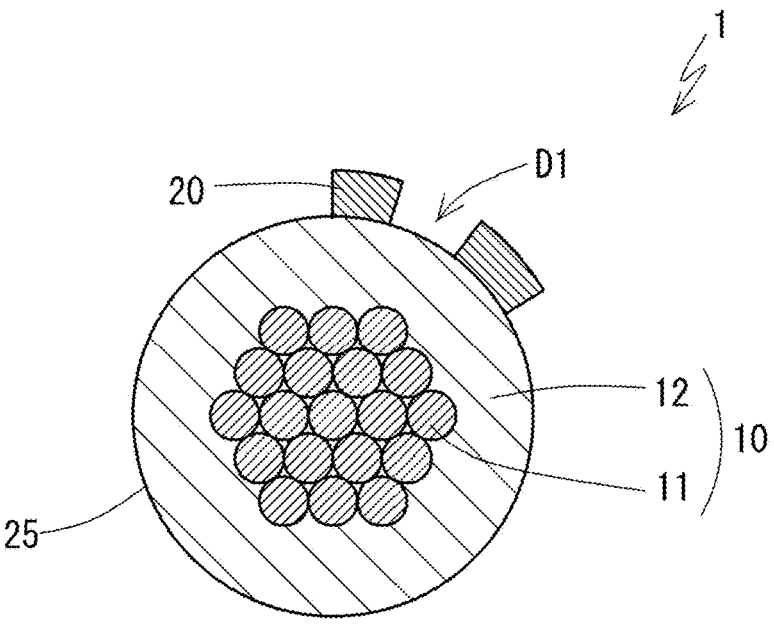

Here, in relation to the electric wire inspection, the following describes the relationship of the characteristic impedance between the conductor 11 and the conductive tape 20 with the external damage D of the electric wire 1. FIGS. 6A and 6B show cross sections of the electric wire 1. In FIG. 6A, no damage D1 is present on the conductive tape 20, but in FIG. 6B, due to the damage D of the electric wire 1, external damage D1 is present on the conductive tape 20 at a corresponding position in the cross-section. The external damage D1 formed on the conductive tape 20 does not necessarily result in breakage of the conductive tape 20; however, for clarity, the conductive tape 20 is illustrated in a partially broken state in the cross-section.

The conductive tape 20 covering the core wire 10 and the conductor 11 constituting the core wire 10 face each other with the insulation coating 12 made of the insulating material (dielectric) interposed therebetween, and a capacitance is defined between the conductive tape 20 and the conductor 11. The capacitance has a positive correlation with the area of the conductive materials facing each other across the dielectric. Therefore, the capacitance is smaller when the external damage D1 is present on the conductive tape 20, as illustrated in FIG. 6B, compared with the case when the external damage D1 is not present on the conductive tape 20, as illustrated in FIG. 6A. The characteristic impedance between the conductive tape 20 and the conductor 11 is greatly affected by the capacitance between the conductive tape 20 and the conductor 11. Therefore, if the capacitance between the conductive tape 20 and the conductor 11 changes due to the presence of the external damage D1 on the conductive tape 20, the characteristic impedance between the conductive tape 20 and the conductor 11 changes consequently.

Figure 7A:
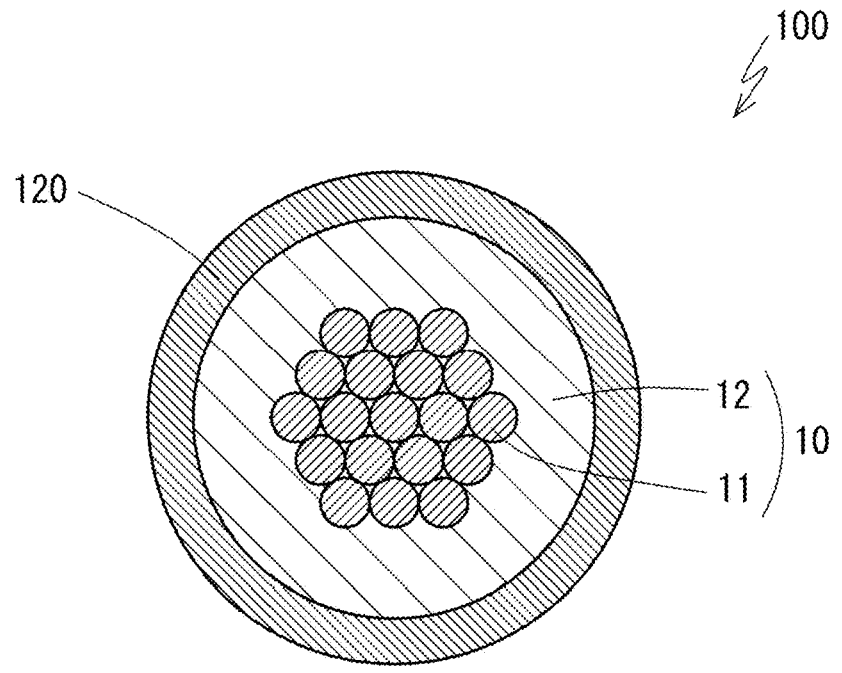
FIGS. 7A and 7B are cross-sectional views each showing the cross-section of an electric wire in the case where a conductive layer completely surrounds a core wire, taken perpendicular to the axial direction, where
Figure 7B:
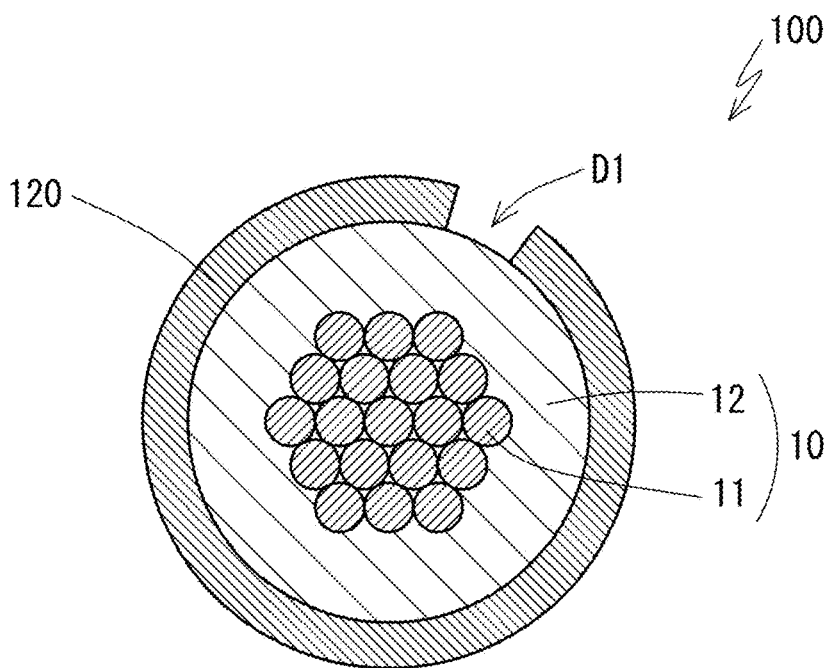

In an electric wire 100 illustrated in FIG. 7A, a conductive material layer 120 is continuously provided on the entire circumference and in the axial direction of the core wire 10. When the conductive layer 120 is formed continuously around the core wire 10, if the external damage D1 occurs in the conductive layer 120 as illustrated in FIG. 7B, the magnitude of the capacitance between the conductor 11 of the core wire 10 and the conductive layer 120 can change theoretically, similarly with the case illustrated in FIG. 6B. If the electric wire 100 has the external damage D that extends almost thoroughly in the circumferential direction and occupies a large region along the axial direction, and the conductive layer 120 also has the damage D1 that extends almost thoroughly in the circumferential direction and occupies a large region along the axial direction, the capacitance between the conductive layer 120 and the conductor 11 changes largely, and the characteristic impedance between the conductive layer 120 and the conductor 11 also changes largely. In practice, however, it is rare that external damage is formed in almost the entire circumference of the electric wire. In many cases, the external damage D caused by contact or friction with external objects is formed only in a partial region in the circumferential direction of the electric wire 1, with having a certain length in the axial direction of the electric wire 1, as shown in FIGS. 8 and 10. When the external damage D is present in a partial region in the circumferential direction of the electric wire 1, if the conductive material layer 120 is provided around the entire circumference of the core wire 10 in the axial direction as shown in FIG. 7A, then the region occupied by the external damage D1 with respect to the entire conductive layer 120 is small, and the rate of change in capacitance (the ratio of change in capacitance relative to initial state capacitance) associated with the presence of the external damage D1 is small. As a result, the rate of change in the characteristic impedance associated with the formation of the external damage D1 is also small. Then, it will be difficult to detect the presence or absence of the external damage D1 by detecting changes in characteristic impedance with high sensitivity.

On the other hand, when the conductive tape 20 is coarsely wound around the core wire 10 with the gaps 25 left between turns as shown in FIG. 5, the conductive tape 20 only partially surrounds the core wire 10 in a cross-section as shown in FIG. 6A, and further the turns of the conductive tape 20 wound in a spiral shape are separated from each other along the axial direction of the core wire 10 due to the gaps 25, if the damage D1 is formed on the conductive tape 20 as illustrated in FIG. 6, the area occupied by the damage D1 is large with respect to areas covered by the conductive tape 20 in the initial state. The capacitance between the conductive tape 20 and the conductor 11 thus changes with a large rate of change. As a result, the characteristic impedance between the conductive tape 20 and the conductor 11 also exhibits a large rate of change. Thus, by detecting the change in the characteristic impedance, the formation of the external damage D1 can be sensitively detected. Even where the external damage D is only partially formed in the circumferential direction of the electric wire 1, if the damage D1 is formed in the conductive tape 20 due to the external damage D, the damage D1 causes change in characteristic impedance sensitively, allowing the detection of the external damage D. Further, even minute external damage D1 is more likely to be detected.

When the conductive tape 20 is wound coarsely around the core wire 10 with the gaps 25, at which the conductive tape 20 is not covered, formed between the turns, where the external damage D is formed only partially around the electric wire 1 as illustrated in FIGS. 8 and 10, if the length of the external damage D along the axial direction of the electric wire 1 is short, the external damage D may not overlap with a part at which the conductive tape 20 is provided, and thus the damage D1 may not be formed in the conductive tape 20. However, when the external damage D is formed on the electric wire 1 by contact or friction with external objects, the external damage D tends to be formed to have a certain length along the lengthwise direction of the electric wire 1. For example, where the electric wire 1 is routed with its bent state in an automobile as shown in FIG. 8, the external damage D may be formed by parts of the electric wire 1 positioned on the outer side of the bent portion contacting an object in its vicinity (such as the body of the automobile). In this case, the external damage D tends to be formed to have a certain length through the contact of the wire 1 at its bent portions with an object. Therefore, if the pitch of the spiral of the conductive tape 20 is set such that the length of the external damage D to be expected is sufficiently long relative to the pitch of the spiral of the conductive tape 20, then the external damage D overlaps in at least one portion in the length thereof with a position where the conductive tape 20 is provided, and which leads to formation of the damage D1 in the conductive tape 20. Accordingly, the change in the characteristic impedance between the conductive tape 20 and the conductor 11 appears through the change in capacitance, thereby allowing the presence of the external damage D1 to be detected.

As described above, when the conductive tape 20 is spirally wound around the core wire 10 with the gaps 25 formed between the turns, if the external damage D is present in the electric wire 1, the external damage D can be sensitively detected by detecting the change in characteristic impedance between the conductive tape 20 and the conductor 11. If the external damage D1 is present in the conductive tape 20 wound around the core wire 10, there is a high possibility that the external damage D is also present in the insulation coating 12 of the core wire 10. Thus, the detection of the external damage D1 formed on the conductive tape 20 may also be treated in detecting that the external damage D is present in the core wire 10, which is the main body of the electric wire 1, or as a substantial precursor of the formation of the external damage D. As illustrated in FIG. 10, when the external damage D1 of the conductive tape 20 is formed as breakage, the amount of change of in characteristic impedance basically tends to increase with formation of the damage D1. However, depending on the type and shape of the electric wire 1, or the form and shape of the external damage D1, for example, the amount of change of the characteristic impedance may be either increased or decreased.

As described above, it is possible to detect the presence or absence of the external damage D in the electric wire 1 by examining whether or not the characteristic impedance between the conductive tape 20 and the conductor 11 of the electric wire 1 changes. Further, if the characteristic impedance is measured by TDR or FDR, it is possible not only to detect the presence or absence of the external damage D, but also identify the position of the external damage D along the axial direction of the electric wire 1. As shown in FIG. 10, when measuring the characteristic impedance between the conductive tape 20 and the conductor 11 on the base end 1A side of the electric wire 1, the measurement results show that the amount of change in the characteristic impedance can be obtained as a function of time if TDR is used, while the amount of change in the characteristic impedance can be obtained as a function of frequency if FDR is used. In either cases, if the damage D1 is present in the conductive tape 20 at its intermediate position in the axial direction of the electric wire 1, the inspection signal is reflected at the position of the damage D1. Thus, the characteristic impedance changes discontinuously at the position corresponding to the damage D1 in the time axis or the frequency axis. In view of this, in the measurement result obtained by TDR or FDR, a region where the value of the characteristic impedance changes discontinuously from the values in the surrounding areas or a region where the value of the characteristic impedance changes from the value of the previous measurement such as the measurement in initial state is defined as a change region R, and it can be determined that the external damage D is present at the electric wire 1 at the position corresponding to the change region R. In this way, it is possible to identify not only the presence or absence of the external damage D on the electric wire 1, but also the position where the external damage D is present.

FIG. 10 schematically illustrates a relationship between the external damage D formed on the electric wire 1 and the measurement result obtained by TDR. The upper part of the figure shows the electric wire 1 with the external damage D, and the lower part shows an example of the measurement result obtained for the electric wire 1 by TDR. In the measurement result, the solid line shows a case where the external damage D is present in the electric wire 1, and the dashed line shows a case where the external damage D is absent in the electric wire 1.

In TDR, there is a proportional relationship between the distance from the base end 1A and the value on the time axis. In the measurement result shown in FIG. 10, time is shown on the horizontal axis and the measured characteristic impedance is shown on the vertical axis, and a peak P, which rises discontinuously from the surrounding area, is observed in the region corresponding to the distance from the base end 1A to the position where the external damage D is formed on the electric wire 1. Although there are also small peak-like structures in the surrounding areas that originate from noise or other elements other than the external damage on the electric wire 1, if the core wire 10 is in the form of a simple straight line, the height of the peak P originating from the external damage D tends to be clearly larger than the peak-like structures unrelated with the external damage D. Further, the measured values obtained in the region having the peak P originating from the external damage D are higher than the ones in the initial state where no external damage D is formed, which are indicated by the dashed line. In this way, by detecting a region where the characteristic impedance is changed discontinuously compared to the values in the surrounding regions or a region where the characteristic impedance is changed from the value in the initial state as the change region R, the position of the change region R on the horizontal axis can be correlated with the position of the external damage D from the base end 1A in the electric wire 1. In other words, by measuring the characteristic impedance, it is possible not only to detect the presence of the external damage D, but also to identify the position where the external damage D is formed along the axial direction of the electric wire 1. As shown in examples described later, the position of the external damage D can be accurately identified within an error range of approximately 200 mm or smaller. Although not illustrated in Figure, in FRD, the frequency is shown on the horizontal axis, and similarly by detecting a region where the characteristic impedance is changed discontinuously compared to the values in the surrounding regions or a region where the characteristic impedance is changed from the value in the initial state as the change region R, it is possible to identify the position where the external damage D is formed along the axial direction of the electric wire 1. In this case, the characteristic impedance is obtained as the function of frequency and can be converted into information about the distance from the base end 1A of the electric wire 1, by performing inverse Fourier transform.

When TDR is used, the inspection signal input to the base end 1A of the electric wire 1 is typically a signal of a rectangular wave pulse. Meanwhile, as an advanced style of TDR, a signal can be used as appropriate as the inspection signal in which signal components of different frequencies are superimposed at a predetermined intensity to form a predetermined waveform other than the rectangular wave. Specifically, of electric signals in which signal components within a continuous frequency range are superimposed with one another at independent intensities for each frequency, those in which frequency components are partly missing (excluded frequency) within the continuous frequency range or has a discontinuously smaller intensity than surrounding frequencies can be used as the inspection signal. The usage of the inspection signal with excluded frequency is known as Multicarrier time domain reflectometry (MCTDR) and is disclosed, for example, in U.S. Patent Application Publication No. 2011/035168. With respect to the inspection signal, by setting the intensities of the frequency components and setting the excluded frequencies, it is possible to reduce the influence of measurement noise and measure the reflected component.

For example, when the electric wire 1 is routed in an environment where other communication devices or communication wires locate in the vicinity, such as the inner side of an automobile, electromagnetic waves originating from the generation source external to the electric wire 1 propagate around the electric wire 1. In this case, setting the excluded frequencies to include the frequencies of these electromagnetic waves eliminates or reduces their effect on the inspection signal, and the components with these frequencies are less likely to affect the measurement result of the characteristic impedance. As a result, the electromagnetic waves propagating in the vicinity of the electric wire 1 are less likely to cause noise in the measurement result of the characteristic impedance of the electric wire 1, and the detection of the external damage D in the electric wire 1 can be performed sensitively with high accuracy. It can be said that MCTDR is a measurement technique which has both the advantages of TDR, in which the measurement result and the position of the external damage D can be directly correlated with each other, and the advantages of FDR, such as resistance to noise.

When detecting the external damage D of the electric wire 1 by FDR or TDR including MCTDR, if the change in the characteristic impedance caused by the external damage D is significant, the external damage D can be detected based on the measurement result of the characteristic impedance itself. Specifically, the peak P corresponding to the external damage D can be detected by searching the measurement result itself to find a region in which the value discontinuously changes as compared with the surrounding area, or by comparing the measurement result with a previous measurement result such as the measurement result of the electric wire 1 in the initial state to find a position where the values change between them. However, when the external damage D is minor, the electric wire 1 is long, or the electric wire 1 is branched as illustrated in FIG. 9 with the core wire 10', for example, the peak P originating from the external damage D may be buried in the peak structure or noise originating from the element other than the external damage D, and the peak P cannot be clearly identified by simply directly examining the measurement result. In such a case, a subtraction detection technique may be used. Specifically, the subtraction is calculated between the measurement result of characteristic impedance at the first time point and the measurement result of characteristic impedance at the second time point after the first time point, the change region R is detected as the region where the value of the subtraction discontinuously changes from the values in the surrounding regions, and the change region R is correlated with the position of the external damage D.

As described above, in the conductive tape-wound electric wire 1, the core wire 10 may be constituted by any kind of electric wire, and may have a single-wire structure described above, or may be in the form of a composite wire (wire harness) containing multiple insulated wires in which the insulation coating 12 surrounds the conductor 11. When the core wire 10 is in the form of a composite wire, the conductive tape 1 is wound around the entire composite wire.

The core wire 10 in the form of a composite wire is preferable in that, regardless of the specific configuration of the composite wire (e.g., the shape and thickness of the composite wire, or the type of the insulated wires contained), the formation of damage on the outer surface of the entire composite wire can be detected sensitively and easily. Meanwhile, the core wire 10 having a single-wire structure is characterized by that the conductive tape 20 plays a large role in measuring characteristic impedance. Specifically, when the core wire includes multiple conductive members such as a shielded cable or pair cable, detection of the external damage D can be made by measuring characteristic impedance of the conductive members that constitute the core wire, such as between the central conductor and the shield conductor, or between pair wires, as described above in configuration (i). On the other hand, the core wire 10 having a single-wire structure contains the conductor 11 as a sole conductive member, and therefore, only when the conductive tape 20 is wound around the conductor 11, detection of the external damage D using characteristic impedance can be performed. Further, in a single-wire structure, winding the conductive tape 20 around the core wire 10 has an excellent effect of reducing the influence of noise and detecting the external damage D with high sensitivity. In other words, shielded cables and pair cables each have an inherent structure to reduce the influence of noise, making it easier to stably obtain characteristic impedance, whereas with respect to a single-wire structure, the characteristic impedance between the conductor 11 and the ground potential is extremely unstable. However, when the core wire 10 having a single-wire structure is used, the characteristic impedance is stabilized if the conductive tape 20 is wound around the core wire 10. By detecting the external damage D with the characteristic impedance stabilized, a change in the characteristic impedance value can be detected with high sensitivity and correlated with the formation of the external damage D.

As described above, the conductive tape 20 should be distinguished from a string-like body, and in the electric wire 1 according to the present embodiment, the conductive tape 20 configured exclusively as tape is used. However, instead of the conductive tape 20, if a conductive string-like body such as a metal wire is spirally wound around the core wire 10, detection of the external damage D may be achieved. When a string-like body is used, the differences in capacitance between the position where the conductive material is provided and the position where the conductive material is not provided on the outer peripheral surface of the core wire 10 is large, thus resulting in instability of the characteristic impedance. As a result, it is difficult to detect the external damage D in association with position with high accuracy. For this reason, the conductive tape 20 configured as tape is used instead of a string-like body such as a metal wire.

In detecting the external damage D by measuring characteristic impedance with the electric wire 1 connected to equipment, it is preferable that the measurement of characteristic impedance using an inspection signal is performed in a static state in which no voltage or current other than the inspection signal is applied to the electric wire 1 to be inspected, in view of improving sensitivity and precision of the detection. In the electric wire inspection system and electric wire inspection method described above, the electric wire inspection is basically performed in such a static state. Meanwhile, measurement of the characteristic impedance can also be performed while a voltage or a current other than the inspection signal is applied to the electric wire 1. For example, with the measuring device 9 being connected to the electric wire 1 at all times, the measurement of characteristic impedance and the detection of external damage D based on the measurement results can be continuously performed while the electric wire 1 is used with a current or a voltage corresponding to the original usage of the core wire 10 applied to the wire 1. Thus, the formation of the external damage D can be monitored in real time while the electric wire 1 is used, and the formation of external damage D, or a precursor of damage formation, can be immediately detected. For example, when the core wire 10 has a single-wire structure, the core wire 10 is used to apply a direct current or a direct current voltage in many cases. In such a case, by inputting an inspection signal consisting of AC components, the characteristic impedance can be suitably measured even while current or voltage is applied to the conductor 11.

Conductive Tape-Wound Electric Wire According to Second Example

Next, a conductive tape-wound electric wire 1' according to a second example will be briefly described. Here, in order to simplify the description, descriptions will not be given for configurations and the effects thereof that are the same as those of the conductive tape-wound electric wire 1 according to the first example. Further, the same electric wire inspection method as that for the conductive tape-wound electric wire 1 according to the first example can be applied to the conductive tape-wound electric wire 1' according to the second example.

Figure 11A:
FIGS. 11A and 11B are diagrams showing a second example of a conductive tape-wound electric wire.
Figure 11A:
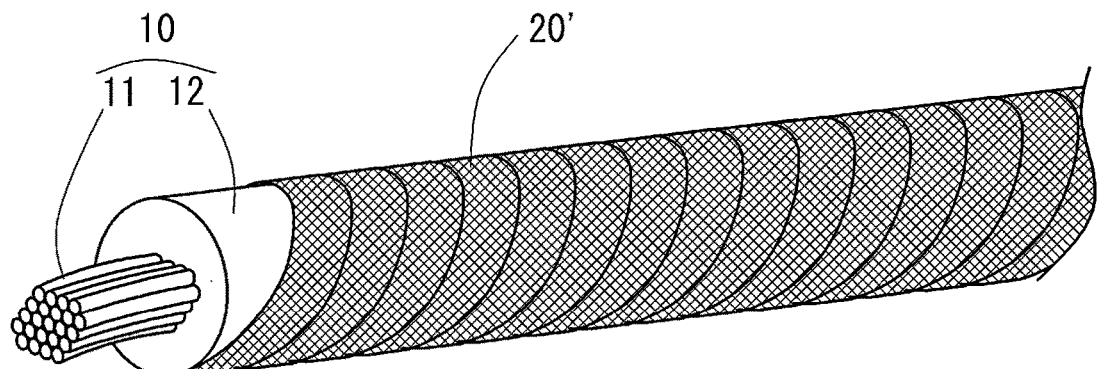
Figure 11B:
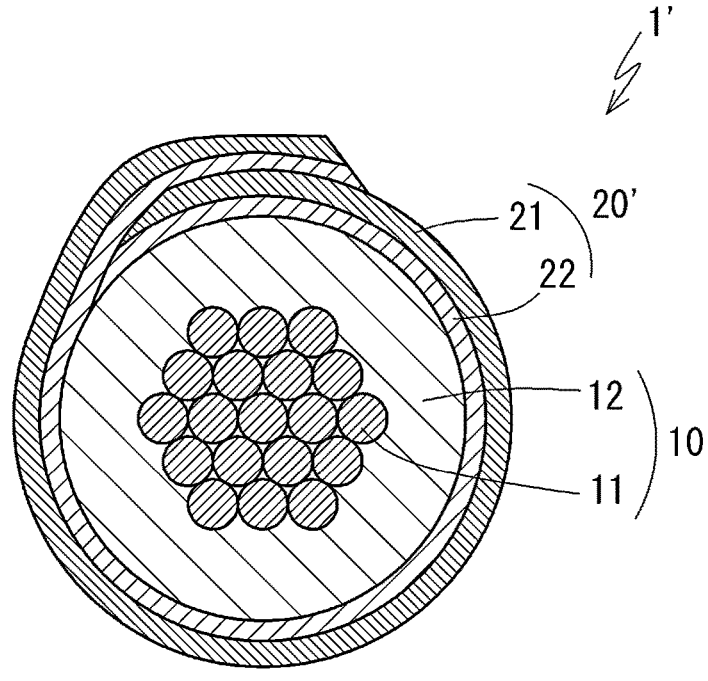

FIGS. 11A and 11B illustrate a conductive tape-wound electric wire 1' according to the second example in a perspective view and a cross-section taken perpendicular to the axial direction, respectively. In the conductive tape-wound electric wire 1 according to the first example, the conductive tape 20 is wound around the core wire 10 with the gaps 25 left between turns of the tape 20, whereas in the conductive tape-wound electric wire 1' according to the second example, a conductive tape 20' is wound around the core wire 10 in a spiral shape with no gaps left between turns of the tape 20'. As the conductive tape 20, a single-sided conductive tape is used in which the conductive layer 21 is formed only on one surface of the base material 22. In the spiral shape of the conductive tape 20', the conductive layer 21 is kept partly not in direct contact with each other between adjacent turns. As described above, the conductive tape 20' may be arranged such that the conductive layer 21 faces either inward or outward relative to the core wire 10. In the illustrated configuration, the conductive tape 20' is wound such that the conductive layer 21 faces the opposite side of the surface where the conductive tape 20' is in contact with the core wire 10, that is to say, the conductive layer 21 faces outward.

In a conductive tape-wound electric wire, as long as the conductive tape 20' is wound without any gaps, the turns of the spirally wound conductive tape 20' may not be over-lapped between adjacent turns, or may be partially over-lapped between adjacent turns as shown in FIG. 11B. From the viewpoint of reliably winding the conductive tape 20' without any gaps, the latter form is preferable, which is to say, the turns of the spirally wound conductive tape 20' are preferably partially overlapped between adjacent turns. In both cases, however, it is necessary to keep that no part of conductive layer 21 is not in direct contact between turns. By using a single-sided conductive tape as the conductive tape 20', it is easy to keep the conductive layer 21 away from contacting each other in any portions, even if the conductive tape 20' is overlapped in portions between turns, unless the conductive tape 20' is twisted or folded.

As described above with reference to FIGS. 7A and 7B, when the conductive material layer 120 is provided continuously on the entire circumference and in the axial direction of the core wire 10, even if damage is partly formed on the outer circumference of an electric wire, the damage occupies a small area with respect to the large area of the conductive material layer 120 that is formed integrally and continuously. Therefore, the rate of change in capacitance caused by formation of the damage will be small, and as a result, the rate of change in characteristic impedance caused formation of the damage will be also small. In contrast, in the conductive tape-wound electric wire 1' according to the second example described here, the conductive layer 21 is wound around the entire circumferential direction of the core wire 10 without any gaps in the axial direction, but no part of the conductive layer 21 is in direct contact between turns of the spiral shape. Thus, continuity of the conductive layer 21 in the axial direction of the core wire 10 is broken between the turns.

Therefore, when external damage is partially formed on the outer circumference of the electric wire 1' and the conductive layer 21 is damaged, if the damage on the conductive layer 21 occupies a certain area in one turn of the conductive layer 21, the rate of change of capacitance increases, and accordingly, the characteristic impedance also changes to some significant degrees. Thus, in the conductive tape-wound electric wire 1' according to the second example as well, the formation of damage can be sensitively detected based on the change in characteristic impedance. Further, by measuring the characteristic impedance using TDR or FDR, it is possible to identify not only the presence or absence of damage formation, but also the position at which the damage is formed along the axial direction of the electric wire 1'. Furthermore, the conductive tape 20' is densely wound around the core wire 10 without any gaps, and therefore the formation of the external damage can be detected with stable sensitivity based on change in characteristic impedance, regardless of where the external damage is formed in the circumferential or the axial direction of the electric wire 1', and high spatial uniformity can be obtained in the detection of external damage. In particular, even when it is assumed that damage occupying only a short region is formed as external damage, the external damage can be detected with high accuracy regardless of the position at which the external damage is formed.

In this way, with both the conductive tape-wound electric wire 1 according to the first example in which the conductive tape 20 is coarsely wound, and the tape-wound electric wire 1' according to the second example in which the conductive tape 20' made of single-sided conductive tape is wound without any gaps, the formation of damage can be sensitively detected based on change in characteristic impedance, and further the position at which the damage is formed can be identified using TDR or FDR. However, in the electric wire 1 of the first example, the gaps 25 are left between the turns of the conductive tape 20, and thus, the damage detection is performed with higher sensitivity, and the damage position can be identified with higher accuracy for the electric wire 1. On the other hand, the electric wire 1' of the second example has particularly excellent spatial uniformity in damage detection because the conductive tape 20 is wound around the core wire 10 without any gaps. The specific configuration of winding of the conductive tape may be set such that the advantages of the respective configurations can be utilized effectively. For example, from the two types of electric wires 1 and 1', which have different configurations in winding of the conductive tape, the electric wire that is more suitable for application should be selected according to the size and position of external damage to be expected, the required detection sensitivity, etc.

Example of Providing Conductive Tape on Composite Wire

Figure 12:
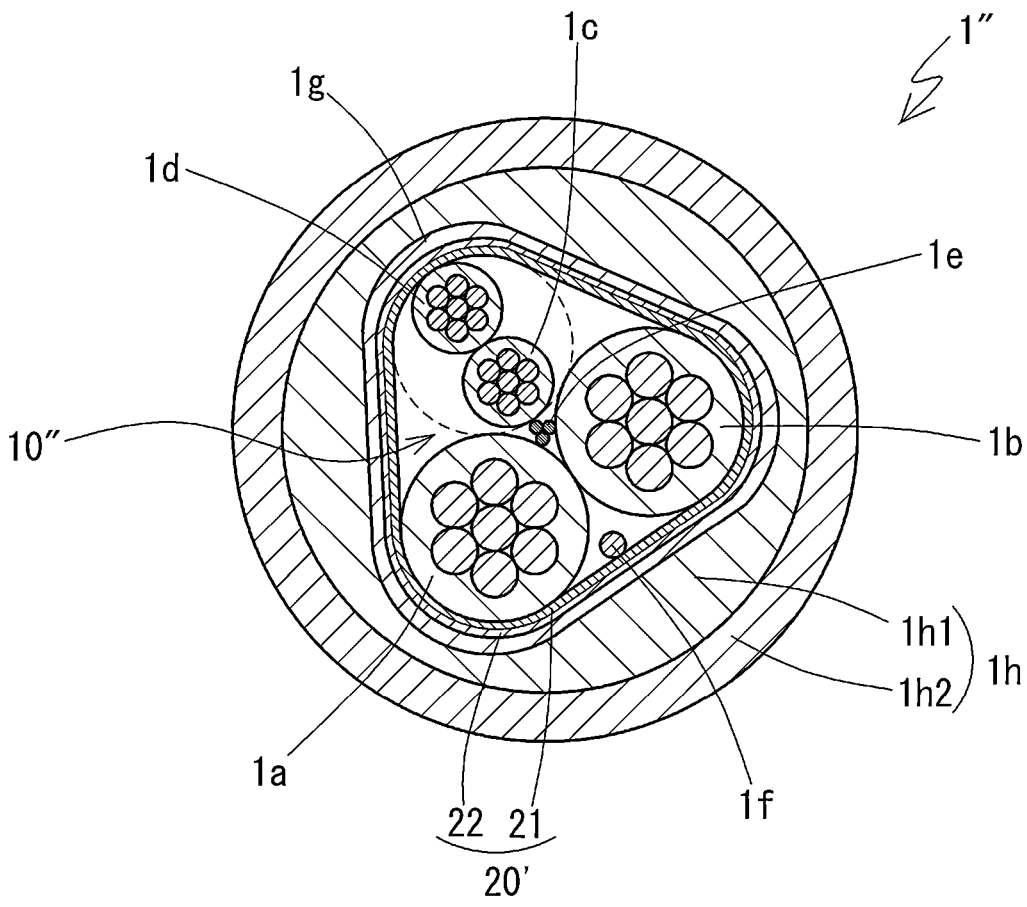
FIG. 12 is a cross-sectional view of an example of a conductive tape-wound electric wire in which the core wire is a composite wire, taken perpendicular to the axial direction.

As described above, in the conductive tape-wound electric wires 1, 1', the core wire around which the conductive tapes 20, 20' are respectively wound may have a single-wire structure, or may be in the form of a composite wire (wire harness) containing multiple insulated wires: however, hereunder, brief description is made for the case of taking the form of a composite electric wire. FIG. 12 is a cross-sectional view of a conductive tape-wound electric wire 1" in which the conductive tape 20' is wound around a core wire 10" in the form of a composite wire, similarly to the conductive tape-wound electric wire 1' according to the second example. Here, description is made on the presumption that the conductive tape-wound electric wire 1" is configured as a composite wire for an electric brake having an external damage detection function, the measuring device

9 is connected to the electric wire 1" at all times, and the state of the core wire 10" in the form of a composite wire is monitored continuously.

In the conductive tape-wound electric wire 1' illustrated in FIG. 12, the insulated wire constituting the core wire 10" contains at least either one of a power supply wire or a communication wire. More specifically, it is preferable that the core wire 10" is configured as a composite wire containing a plurality of twisted wires containing a power supply wire and a communication wire for an electric brake device of an automobile. In the illustrated configuration, the core wire 10" contains four insulated wires 1a to 1d. In the four insulated wires 1a to 1d, two wires 1a and 1b are power supply wires and twisted together to form a twisted pair, while the other two wires 1c and 1d are communication wires 1c and 1d and twisted together to form a twisted pair. Further, the twisted pair of 1a and 1b, and the twisted pair of 1c and 1d are twisted together to constitute all together a single wire. Also, the core wire 10" may contain a disconnection detection wire 1e in the portion surrounded by the four insulated wires 1a to 1d, and may also contain a drain wire 1f at its outermost portion. The disconnection detection wire 1e is an insulated wire containing a conductor that has lower bending resistance than the conductors of the insulated wires 1a to 1d and is more easily broken by bending. The precursor of disconnection of the insulated wires 1a to 1d can be detected through breakage of the disconnection detection wire 1e. The drain wire 1f is configured as a conductor wire that is not covered with an insulator, and is in contact with the conductive tape 20' wound around the core wire 10", at any position along the axial direction, for obtaining of conductivity.

The conductive tape 20' is wound around the core wire 10". In the illustrated configuration, single-sided conductive tape containing the conductive layer 21 and the base material 22 is wound completely around the core wire 10" such that no gaps are formed and the conductive tape 20' is partly not in direct contact with each other between turns. The conductive layer 21 is arranged to face the core wire 10" (the inward of the electric wire 1"). However, as with the conductive tape-wound electric wire 1 according to the first example described above, either one of single-layer conductive tape, single-sided conductive tape, or double-sided conductive tape is wound with gaps left between pitches. A pressure winding layer 1g made of insulating tape may be optionally formed around the conductive tape 20'. A sheath 1h formed by extrusion of insulating resin is formed around the pressure winding layer 1g. In the illustrated configuration, the sheath 1h has two layers, namely an inner layer 1h1 and an outer layer 1h2.

In the electric wire 1" in the form of a composite wire with the conductive tape 20' wound around the core wire 10", the conductive tape 20' is electrically connected to a measuring unit installed in the electric brake device, and the characteristic impedance is monitored at all times or frequently. In this case, the characteristic impedance 20' may be measured between the conductive layer 21 of the conductive tape 20' and another conductive material contained in the electric wire 1', such as the conductor of any one of the insulated wires 1a to 1d and the disconnection detection wire 1e. Damage on the power supply wires 1a, 1b or the communication wires 1c, 1d contained in the electric brake device, may have a significant impact on the brake system and even the entire automobile. However, by continuously monitoring the formation of damage through measurement of characteristic impedance using the conductive tape 20', it is possible to quickly detect the formation of damage or a precursor of the formation of damage. By notifying the driver of the automobile as appropriate, it is possible to suppress or prevent the influence of damage. Furthermore, by measuring the characteristic impedance using TDR or FDR, it is possible to identify the position at which damage or a precursor of damage is present along the axial direction of the electric wire 1".

Further, where the disconnection detection wire 1e is arranged in the core wire 10", when a precursor of disconnection of any one of the insulated wires 1a to 1d constituting the core wire 10" is confirmed through monitoring of the characteristic impedance of the disconnection detection wire 1e, the precursor of disconnection of any of the insulated wires 1a to 1d can be detected before the actual occurrence of disconnection by previously detecting breakage of the disconnection detection wire 1e with a lower conductor bending resistance. In this case as well, by using TDR or FDR, it is possible to identify the position at which a precursor of electric wire disconnection occurs in the axial direction of the electric wire 1". Thus, by using the conductive tape 20' for detecting external damage and the disconnection detection wire 1e for detecting a precursor of disconnection, it is possible to detect a precursor of conductor disconnection in addition to external damage, among various types of damage that may be formed in electric wires, and to further identify the corresponding position.

[2] Laminated Tape-Wound Electric Wire

Next, a laminated tape-wound electric wire 3 will be described as an electric wire according to the second embodiment. Here, in order to simplify the description, descriptions will not be given for configurations that are the same as those of the conductive tape-wound electric wire 1 according to the first example and the inspection method, and the effects thereof.

(Configuration of Laminated Tape-Wound Electric Wire)

Figure 13A:
FIG. 13A is a perspective view illustrating a configuration of a laminated tape-wound electric wire as an electric wire according to a second embodiment of the present disclosure.
Figure 13A:
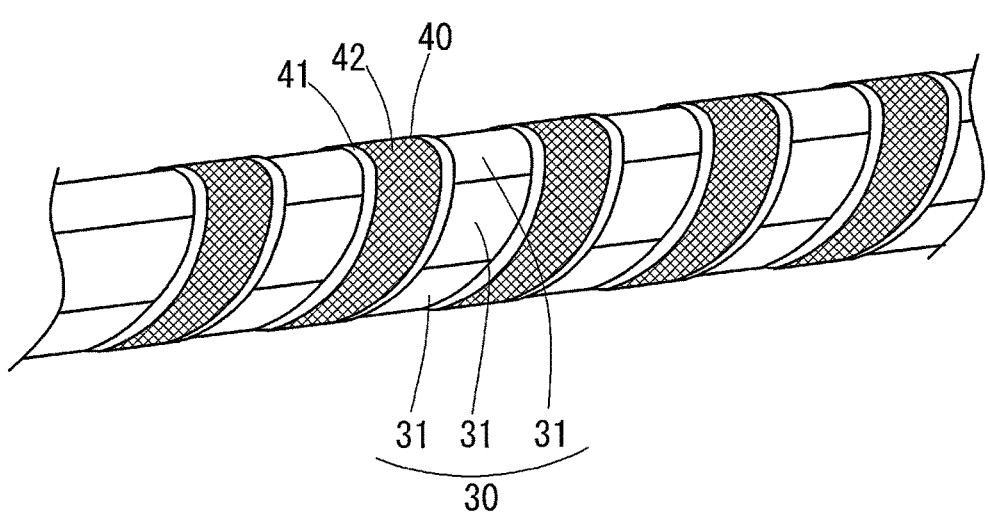

FIG. 13A schematically illustrates a perspective view of the laminated tape-wound electric wire 3. In the laminated tape-wound electric wire 3, a laminated tape 40 is spirally wound around the core wire 30. Similarly to the conductive tape 20, the laminated tape 40 may be wound around a core wire having a single-wire structure, or may be wound around a core wire 30 in the form of a composite wire (wire harness) containing a plurality of insulated wires: however, the laminated tape 40 is preferably wound around the entire core wire 30 in the form of a composite wire containing a plurality of insulated wires 31 as shown in FIG. 13A. In this case, the laminated tape-wound electric wire 3 is in the form of a so-called laminated tape-wound electric wire harness, and in this description, an electric wire in such form will also be referred to as the laminated tape-wound electric wire 3. The laminated tape 40 may be directly wound around a bundle of the insulated wires 31 (wire bundle), or may be wound around an exterior member such as a tube in which the electric wire bundle is housed.

Figure 13B:
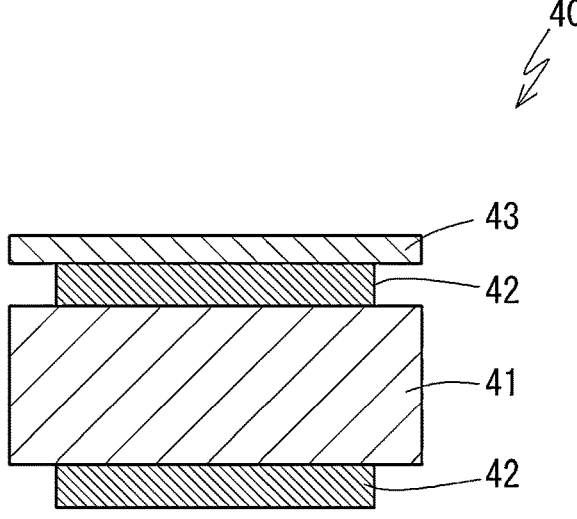
FIG. 13B is a cross-sectional view illustrating the laminated structure of the laminated tape.

The laminated tape 40 has a conductive coating layer 42 on each of the two surfaces of a base material 41 constituted by a tape-like insulator or a semiconductor, as shown in a cross-sectional view (a cross-section orthogonal to the lengthwise direction of the tape) in FIG. 13B. In the laminated tape 40, the coating layers 42, 42 provided on the two surfaces of the base material 41 function as two conductive members of the damage detection member in the configuration (ii) described above.

In the laminated tape 40, the constituent material of the base material 41 is not particularly limited as long as it is an insulator or a semiconductor, but it is preferable to use a flexible tape-like insulator. Favorable examples of the constituent material of the base material 41 include nonwoven tape and polymer tape. From the viewpoint of obtaining a certain distance between the two coating layers 42, 42 and enhancing the detection of damage based on change in impedance, it is preferable that the base material 41 has a certain thickness, and from this viewpoint, it is especially preferable that the base material 41 is formed using a nonwoven tape. Alternatively, a functional material can also be used as the base material 41. A functional material has an electrical property, such as a dielectric constant that changes depending on an external environment characteristic such as temperature or humidity. For example, if a hygroscopic polymer sheet is used as the base material 41, when the base material 41 has contact with water, the dielectric constant and conductivity of the contact portion changes, causing a change in impedance.

The materials constituting the coating layers 42, 42 are not particularly limited as long as they are conductive materials, but metals such as copper or a copper alloy, aluminum or an aluminum alloy can be suitably used. Examples of methods of forming the coating layers 42, 42 on the two surfaces of the base material 41 include adhesion of metal sheets, metal vapor deposition, and plating. The thickness of each coating layers 42, 42 is not particularly limited, but it is preferable to be thin enough to allow breakage or short circuit occur due to external damage that may be formed on the laminated tape-wound electric wire 3, and to cause a sufficient change in characteristic impedance. The two coating layers 42, 42 are insulated from each other.

An adhesive tape 43 may be provided on one surface of the coating layer 42, as appropriate. Using the adhesive tape 43, the laminated tape 40 wound around the core wire 30 containing the plurality of the insulated wires 31 can be fixed onto the core wire 30. If the laminated tape 40 is directly wound around the core wire 30 formed as a bundle of electric wires containing a plurality of insulated wires 31, when the electric wire bundle is held together by the laminated tape 40 via the adhesive tape 43, the laminated tape 40 can play both role of the damage detection member and role of a binding member for preventing the electric wire bundle from loosen.

In FIGS. 13A and 13B, the coating layers 42, 42 are not formed at the two end portions of the laminated tape 40 in the width direction, and the base material 41 is partially exposed thereat. However, the base material 41 is not necessary required to be exposed, and the coating layers 42, 42 may cover the entire surfaces of the base material 41. Meanwhile, by leaving portions in which the coating layers 42, 42 are not formed at the two end portions of the base material 41 in the width direction, it is possible to suppress the coating layers 42, 42 placed on the both two surfaces from contacting with each other at the end portions of the laminated tape 40, causing unintentional short circuit. Also, when the base material 41 is made of a functional material having an electrical characteristic that changes depending on the external environment, if the base material 41 is exposed and in direct contact with the external environment, change of the external environment can be reflected sensitively, enhancing the change of the electrical characteristic.

In the laminated tape-wound electric wire 3, the laminated tape 40 is spirally wound around the core wire 30 in the form of a composite wire. In this case, as in the case of the conductive tape 20 and 20' in the conductive tape-wound electric wires 1 and 1', the laminated tape 40 may be wound with no gaps left between turns of the spiral structure, or may be wound such that gaps narrower than the length of the expected damage are left between turns. In the laminated tape 40, even if gaps are left between turns, the sensitiveness of damage detection will not be improved unlike the conductive tapes 20, 20', and therefore, the laminated tape 40 is preferably wound with no gaps left between turns from the viewpoint of increasing spatial uniformity in detection. In this case, from the viewpoint of enhancing accurate measurement of the characteristic impedance between the two coating layers 42, 42, it is preferable to keep the coating layers 42, 42 of the laminated tape 40 not to contact with each other between the turns. Specifically, with respect to the two coating layers 42, 42, it is preferable that partial contact between the same coating layer 42 (i.e., partial contact between the same outer coating layer or partial contact between the same inner coating layer) and contact between different coating layers 42, 42 (i.e., contact between the outer coating layer and the inner coating layer) is prevented from occurring between turns. It is preferable that the layer of the laminated tape 40 is exposed on the outer surface of the entire laminated tape-wound electric wire 3.

(Electric Wire Inspection Method)

In the laminated tape-wound electric wire 3, the two conductive coating layers 42, 42 of the laminated tape 40 are used a damage detection member, and damage can be detected by measuring the characteristic impedance between the two coating layers 42, 42 as electric wire inspection. In electric wire inspection, damage on the coating layers 42, 42 of the laminated tape 40 is directly detected, but the aim of the electric wire inspection is to detect, using the damage on the coating layers 42, 42 as an indicator, the presence of external damage on the core wire 30 (or each insulated wire 31), or a precursor of formation of the external damage.

Where no damage is formed on the laminated tape-wound electric wire 3, the two coating layers 42, 42 constituting the laminated tape 40 are insulated from each other by the base material 41, are formed as conductive continuous bodies extending in the lengthwise direction of the laminated tape 40, and have a conductance defined by the material, thickness, and the like of the base material 41 and the coating layers 42, 42. Here, if damage occurs on the laminated tape 40 and the conductance between the two coating layers 42, 42 changes, the change of the conductance component is observed as change in the characteristic impedance between the two coating layers 42, 42. For example, if the laminated tape-wound electric wire 3 has contact or friction with an external object, and at least one of the two coating layers 42, 42 (usually the outer coating layer) is broken at an intermediate portion in the lengthwise direction of the laminated tape 40, then the conductance between the two coating layers 42, 42 decreases while the characteristic impedance between the two coating layers 42, 42 increases.

In addition to breakage of the coating layers 42, 42A, a short circuit between the two coating layers 42, 42 is assumed as damage which might be formed on the laminated tape 40. For example, if a sharp conductor such as a metal piece is pressed into the laminated tape 40 from the outside and penetrates the laminated tape 40, the two coating layers 42, 42 will be short-circuited via the conductor. Alternatively, if the laminated tape 40 is subjected to severe friction or pressure, and breakage or damage is formed even in the layer of the base material 41, resulting in the coating layers 42, 42 on the two surfaces of the base material 41 to be contacted with each other without interposing the base material 41 therebetween, then a short circuit may also occur. When a short circuit occurs, the conductance between the two coating layers 42, 42 increases, and the characteristic impedance decreases.

Thus, as electric wire inspection, the characteristic impedance between the two coating layers 42, 42 constituting the laminated tape 40 is measured, and damage on the core wire 30 (or each insulated wire 31) around which the laminated tape 40 is wound can be detected by comparing the characteristic impedance of a signal at a first time point and the characteristic impedance of a signal at a second time point both obtained as a response. Specifically, if a difference exists between the characteristic impedance obtained at the first time point and the characteristic impedance obtained at the second time point, it is possible to detect that damage occurs in the core wire 30 (or the insulated wires 31) around which the laminated tape 40 is wound, or the core wire 30 is in a precursor of the formation of damage. Furthermore, if the laminated tape-wound electric wire 3 has a relatively simple structure, such as a straight structure, the type of damage can be estimated based on the direction of change in the characteristic impedance. When the characteristic impedance changes in the increasing direction, it can be estimated that damage such as breakage occurs in the coating layers 42, 42 of the laminated tape 40, whereas when the characteristic impedance changes in the decreasing direction, it can be estimated that damage such as a short circuit occurs between the coating layers 42, 42.

By appropriately using subtraction detection for the laminated tape-wound electric wire 3 similarly to the conductive tape-wound electric wire 1 described above, it is possible to detect damage sensitively and accurately even if the amount of change in the response signal is small, or an element other than damage exists which may cause change in the response signal, such as a branched portion. Also, similarly to the case of the conductive tape-wound electric wire 1, by using TDR (including MCTDR) or FDR, it is possible to determine not only the presence or absence of damage but also the position at which damage is detected.

In the laminated tape-wound electric wire 3, when the base material 41 constituting the laminated tape 40 is constituted by a functional material having an electrical characteristic that changes depending on an external environment characteristic such as temperature or humidity, it is possible to detect, as damage, changes caused by the external environment, such as water exposure in addition to physical damage causing breakage or a short circuit of the coating layers 42, 42. This is because when the electrical characteristic of the base material 41, such as the dielectric constant, change due to a change of the external environment, the characteristic impedance between the two coating layers 42, 42 also changes. On the other hand, if only physical damage needs to be detected without being affected by the external environment, then a material having an electrical characteristic that is rarely affected by the environment should be used as the base material 41.

Herein, although description has been mainly made for the case where the base material 41 is constituted by an insulator, damage can be similarly detected by the electric wire inspection also in the case where the base material 41 is constituted by a semiconductor. Furthermore, when the base material 41 is constituted by a semiconductor and a measuring device is connected at all times to the two coating layers 42, 42 of the laminated tape 40 for continuous monitoring, the sensitivity of damage detection can be increased by taking advantage of the base material 41 being constituted by a semiconductor. Specifically, the characteristic impedance between the two coating layers 42, 42 should be measured with a voltage that is low enough not to cause a short circuit through the base material 41 between the two coating layers 42, 42. In this state, if the laminated tape 40 is subjected to pressure or the like, and dielectric breakdown occurs between the two coating layers 42, 42, a short circuit will occur between the two coating layers 42, 42, and which can be detected as a change in characteristic impedance. Thus, damage caused by physical contact between the two coating layers 42, 42, but not leading to a short circuit of the two coating layers 42, 42 can be sensitively detected.

Unlike the conductive tape-wound electric wire 1 described above, in the laminated tape-wound electric wire 3, the constituent members of the core wire 30 are not used as the damage detection member, and the damage detection member is constituted by only the constituent members of the laminated tape 40 provided separately from the core wire 30. The laminated tape 40 used here has a more complex structure than the conductive tape 20 described above, however, by not using the constituent members of the core wire 30 as the damage detection member, the damage detection function can be provided regardless of the type or configuration of the insulated wire 31 constituting the core wire 30. In other words, as long as the laminated tape 40 can be wound around the outer peripheral surface, the damage detection member can be provided for insulated wires of various structures and types, and for composite wires containing a plurality of insulated wires. As a preferred example, in the electric wire 1″ having the core wire 10″ in the form of a composite wire illustrated in FIG. 12, the laminated tape 40 may be wound around the core wire 10″ instead of the conductive tape 20′. Furthermore, the constituent members of the core wire 30 are not used in damage detection using the laminated tape 40. Thus, by simply winding the laminated tape 40 around any long size member other than an electric wire or a composite wire, damage on the member can be detected similarly in the configuration described above.

EXAMPLES

Figure 14:
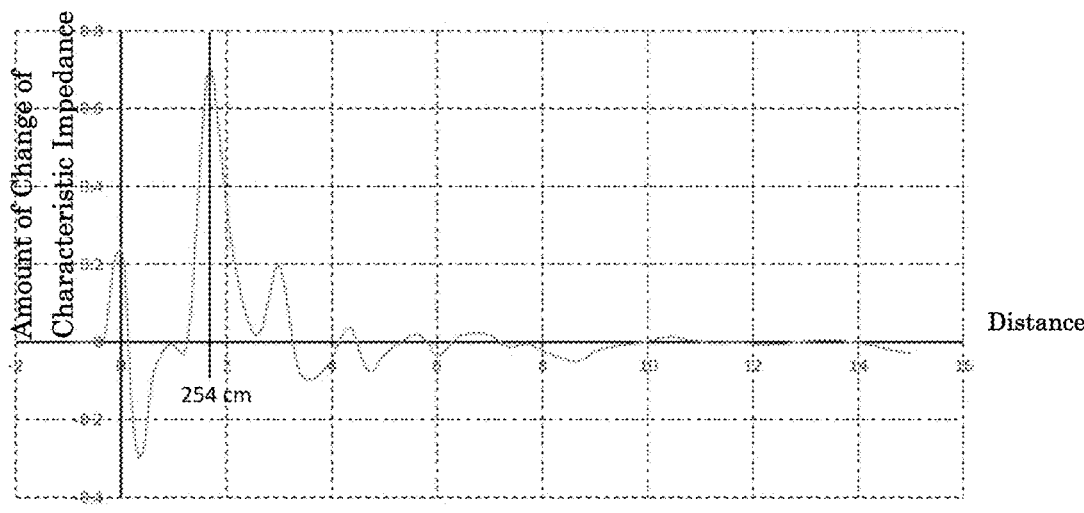
FIG. 14 is a diagram showing an example of the measurement results of characteristic impedance when simulated damage is formed on a straight conductive tape-wound electric wire.

The following describes examples. Note that the present invention is not limited to the examples.
[1] Conductive Tape-Wound Electric Wire
First, it was examined whether damage detection by measuring characteristic impedance is possible for a conductive tape-wound electric wire.
[1-1] Detection of External Damage on Straight Wire
First, it was examined whether detection of external damage by measuring characteristic impedance is possible for a straight conductive tape-wound electric wire.
(Preparation of Samples)
An electric wire having a single-wire structure and a total length of 10 m was prepared as the core wire. A conductive tape made of copper foil was coarsely wound around the core wire in a spiral shape with gaps left between pitches to obtain a sample electric wire. The pitch of the spiral shape was 10 mm. The ratio of the width of the conductive tape to the width of the gap not occupied by the conductive tape was approximately 1:1.
In the sample electric wire, simulated damage was formed at a predetermined distance from the base end. Namely, breakage was formed in the conductive tape in one place at a predetermined position. A plurality of sample electric wires were prepared by changing the position of the simulated damage formed along the axial direction of the electric wire.
(Detection of External Damage)
At the base end of each sample electric wire prepared above, the characteristic impedance was measured between the conductor of the core wire and the conductive tape. Measurement was performed using MCTDR. During the measurement, the electric potential of the conductive tape was kept in a floating state.
(Results)
FIG. 14 shows, as an example, the measurement results of characteristic impedance when simulated damage was formed at a distance of 232 cm from the base end of the sample electric wire. In FIG. 14 and FIGS. 15 to 16C described later, the horizontal axis represents the time axis converted to the distance from the base end, and the vertical axis represents the characteristic impedance. Note that the numerical values on the horizontal axis indicate an amount value proportional to the distance, not an absolute value of the distance. The characteristic impedance on the vertical axis is represented by the amount of variation, with the value at zero distance set as zero.

The measurement results in FIG. 14 show that, in addition to the large fluctuations originating from the device connection near the zero distance, there is a clear peak structure discontinuously rising from the surrounding region at a position corresponding to a distance of 254 cm. This peak structure can be associated with change in the characteristic impedance caused by damage. The peak top position corresponds to a distance of 254 cm while the actual position of the damage was 232 cm, within an error range of approximately 20 cm. The results appear that by measuring the characteristic impedance between the conductive tape and the conductor constituting the core wire, it is possible to detect the formation of damage, and further identify the position of the damage with high accuracy.

Figure 15:
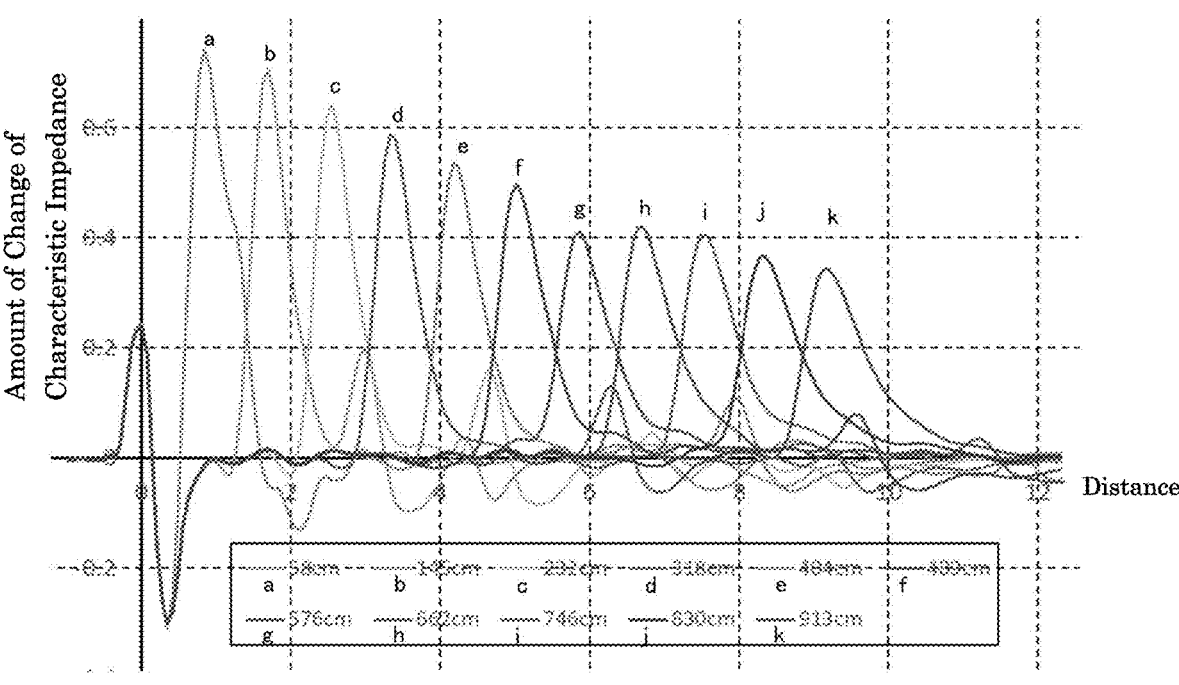
FIG. 15 is a diagram showing the measurement results of characteristic impedance when the position at which damage is formed on the straight conductive tape-wound electric wire is changed.

Also, FIG. 15 shows the measurement results of several sample wires in which simulated damages are formed in different positions. The damage was formed at the positions (i.e., distances from the base end) indicated in the legend, corresponding to the symbols in the graph. According to FIG. 15, from a to k, as the position where the damage is formed is away from the base end, the peak top of the characteristic impedance is positioned on the far side in distance. The values in distances of the peak tops all coincide with the actual positions of the damages each within an error range of approximately 20 cm. Thus, it appears that by using the measurement of characteristic impedance, it is possible to detect the formation of damage up to a distance of approximately 10 m, and furthermore identify the position of the damage formation with a resolution of approximately 20 cm. From a to k, as the position where the damage is formed is away from the base end, the height of the peak becomes smaller, and the width of the peak becomes wider. In other words, as the position of the damage is away from the base end, the detection sensitivity and the resolution to identify the position of damage tends to decrease.
[1-2] Detection of External Damage on Branched Electric Wire
Next, it was examined whether damage detection by measuring characteristic impedance is possible for a branched electric wire.
(Preparation of Samples)
An electric wire having a branched structure as shown in FIG. 9 was prepared as a core wire. Here, branch lines 15A to 15C respectively branch off from three branched portions 13A to 13C formed in the middle portion in a main line 14. Conductive tape was coarsely wound around the main line 14 and the branch lines 15A to 15C of the core wire 10′ in a spiral shape to obtain a sample electric wire. The portions of the conductive tape wound around the main line 14 and the branch lines 15A to 15C were electrically contacted with each other. The type of conductive tape used, the pitch of spiral, and the ratio of the width of the conductive tape to the width of the gap were the same as in the above test [1-1]. Simulated damage of breakage was formed in the conductive tape at predetermined positions on the main line and the branch lines of the sample electric wire.

(Detection of External Damage)

Similar to the above test [1-1], characteristic impedance was measured using MCTDR.

(Results)

Figure 16A:
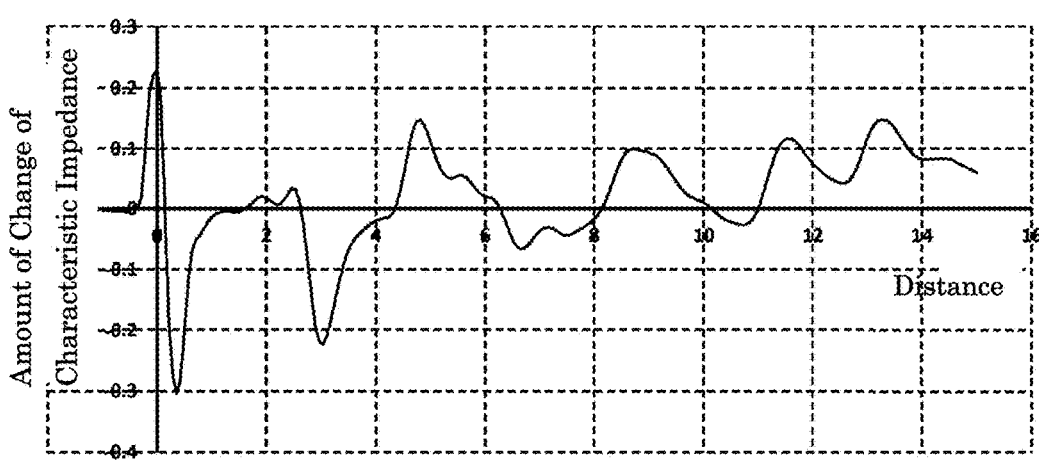
FIGS. 16A to 16C are diagrams each showing the measurement results of characteristic impedance for a conductive tape-wound electric wire having a branch, where
Figure 16B:
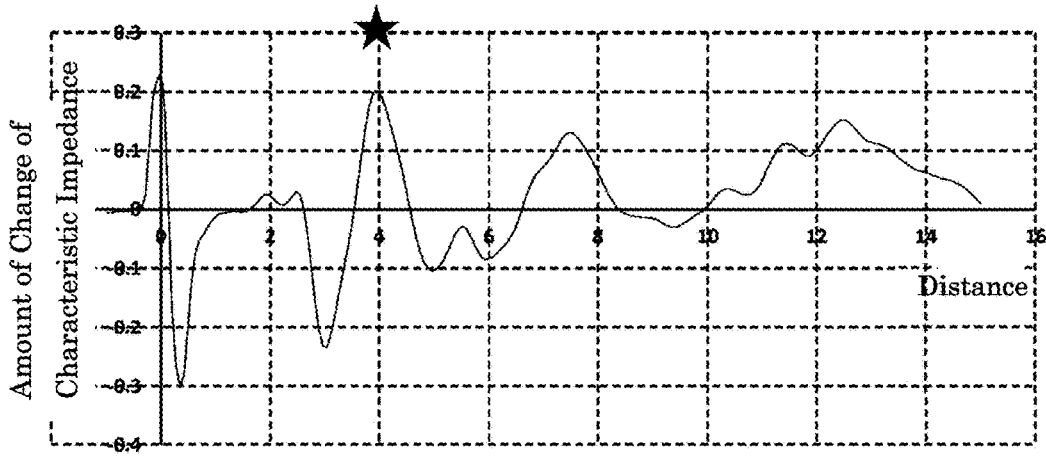

FIG. 16A shows measurement results in the case where no damage was formed. On the other hand, FIG. 16B shows measurement results in the case where damage was formed on the branch line 15A extending from the branched portion 13A closest to the base end. The distance from the base end 1A to the damage across the branched portion 13A was 4.0 m.

Comparing the measurement result where no damage was formed which is shown in FIG. 16A and the measurement result where damage was formed which is shown in FIG. 16B, they exhibit very similar pattern. An upward peak, which does not exist in FIG. 16A, appears near the location where the damage was formed, which is indicated by the asterisk in FIG. 16B, and the peak can be associated with change in characteristic impedance caused by the formation of the damage. However, in addition to this peak, many peak structures of the same or greater magnitudes in both the upward and downward directions appear, causing difficulty in clearly distinguishing the peak corresponding to the formation of damage from other peak structures and identifying the formation of damage.

Figure 16C:
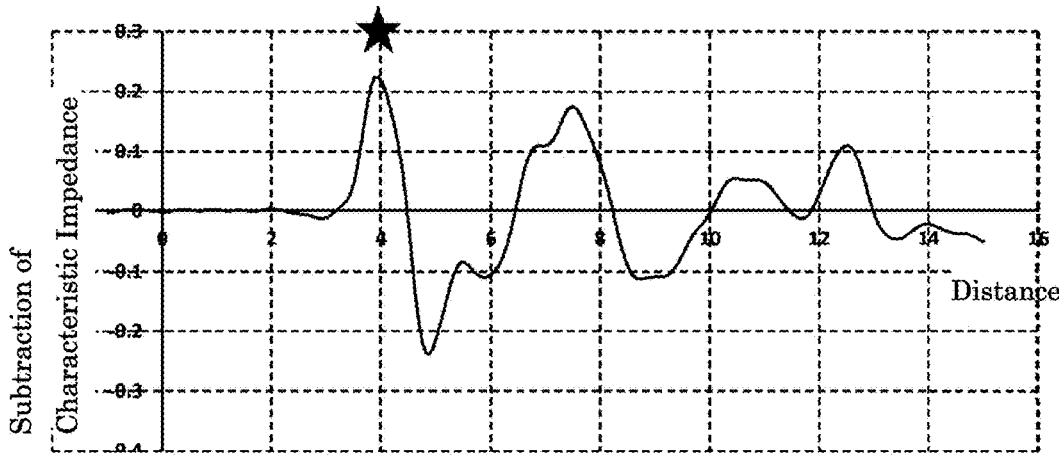

FIG. 16C shows subtraction between the measurement results shown in FIGS. 16A and 16B. The subtraction was obtained by subtracting the values of characteristic impedance obtained before damage was formed which are shown in FIG. 16A from the values of characteristic impedance obtained after damage was formed which are shown in FIG. 16B. In FIG. 16C showing the subtraction, the noticeable peak structures are not found which appear in the near side area in distance in the measurement results in FIGS. 16A and 16B. In contrast, an upward peak clearly remains at the location where the damage was formed, as indicated by the asterisk.

Thus, by calculating subtraction between the measurement results of characteristic impedance before and after the formation of damage, it is possible to clearly identify the change in characteristic impedance resulting from the formation of damage and to correlate the change with damage. The results are not shown in Figures, but by using the subtraction in the same manner as the method described above, damage formed on the branch line 15B extending from the branched portion 13B, which is the second branched portion from the base end, could also be detected based on the change in characteristic impedance. The results appear that also in the case where the core wire has a branch, damage can be detected by measuring the characteristic impedance between a conductor constituting the core wire and the conductive tape, and in particular, by using subtraction from the state where damage is not formed, damage can be detected with high sensitivity. Regardless of whether the damage was formed on the main line or a branch line, it was difficult to clearly detect a change in characteristic impedance corresponding to the damage formed beyond the branched portion 13C, which is the third branched portion from the base end, since the distance from the base end was too large.

[2] Laminated Tape-Wound Electric Wire

Lastly, it was examined whether damage could be detected in a laminated tape-wound electric wire as well.

(Preparation of Sample)

The laminated tape was formed by cutting an insulating nonwoven fabric into a tape shape and sandwiching it between pieces of copper tape having 0.1 mm thick and 8 mm wide. The nonwoven tape and the pieces of copper tape were bonded together by interposing an adhesive layer. The laminated tape was spirally wound around a resin hose (outer diameter of 10 mm, length of 7 m) simulating an electric wire harness. The laminated tape was fixed to the resin hose using adhesive tape. In the winding, the pitch of the spiral was approximately 25 mm. The ratio between the width of the laminated tape and the width of the gaps not occupied by the laminated tape was approximately 1:1.

Two types of simulated damages were formed in the above sample. As the first type of damage, breakage was formed on the outer layer of the two layers of copper tape of the laminated tape. The breakage was formed at a distance of 4.5 m from the base end of the sample. As the second type of damage, a metal pin was penetrated through the laminated tape to create an electrical short between the two layers of copper tape. The short circuit was formed at a distance of 5 m from the base end of the sample.

(Detection of Damage)

At the base end of the sample prepared as described above, a reflection coefficient $\rho$ was measured between the two layers of copper tape constituting the laminated tape. Measurement was performed using MCTDR. During the measurement, the potential of the two layers of copper tape was kept in the floating state. 1f the characteristic impedance between the two layers of copper tape is represented by Z0 at the undamaged position and by ZL at the damaged position, the reflection coefficient $\rho$ is expressed by the following formula (1):

$$\rho = (Z_L - Z_0)/(Z_L + Z_0) \tag{1}$$

In other words, when the characteristic impedance increases at the damaged position, the reflection coefficient also increases, and when the characteristic impedance decreases at the damaged position, the reflection coefficient also decreases. Accordingly, in this examination, the reflection coefficient is measured as a characteristic instead of the characteristic impedance.

(Results)

Figure 17A:
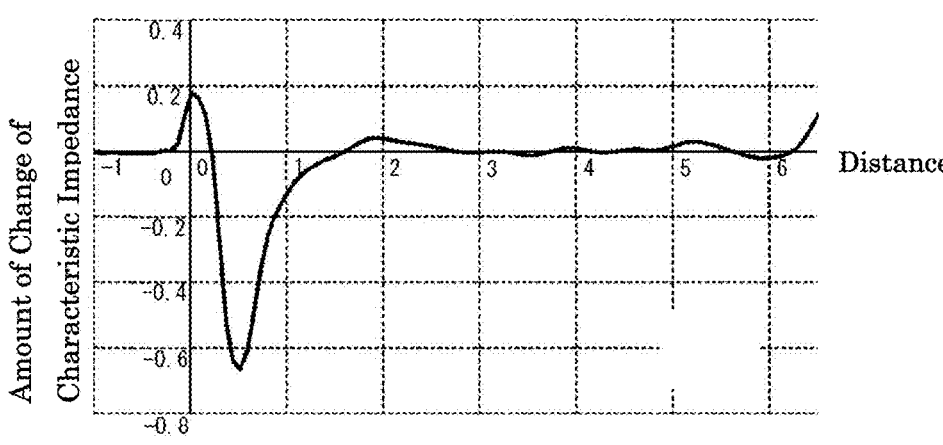
FIGS. 17A to 17C are diagrams each showing the measurement results of characteristic impedance of a straight laminated tape-wound electric wire.
Figure 17B:
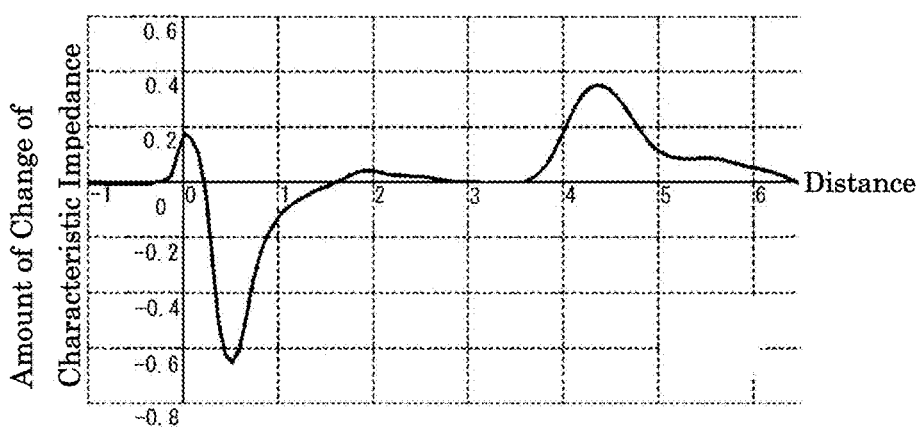
Figure 17C:
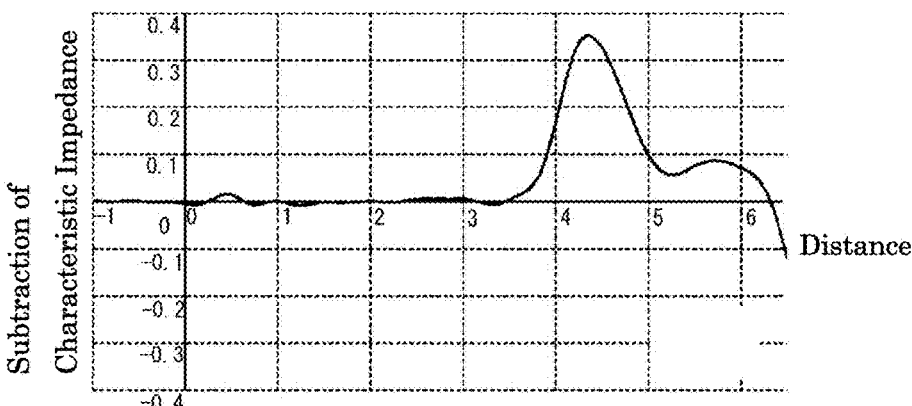

First, results will be examined for the case where breakage was formed in the copper tape as external damage. FIG. 17A shows measurement results of the reflection coefficient under normal conditions before the formation of the breakage, and FIG. 17B shows measurement results of the reflection coefficient after the formation of the breakage. In FIGS. 17A to 17C, the horizontal axis represents the time axis converted to the distance from the base end (unit: m), and the vertical axis represents the reflection coefficient $\rho$. In the measurement results after the formation of breakage in FIG. 17B, a positive peak, which is not observed in the normal measurement results in FIG. 17A, is observed around distance of 4.5 m, in addition to the large fluctuations originating from the device connection portion near the zero distance. FIG. 17C shows subtraction obtained by subtracting the values of reflection coefficient obtained before breakage was formed from the values of reflection coefficient after breakage was formed. In the subtraction, the structure of the positive peak can be clearly observed.

Next, results will be examined for the case where a short circuit is formed in the copper tape as external damage. FIG.

Figure 18A:
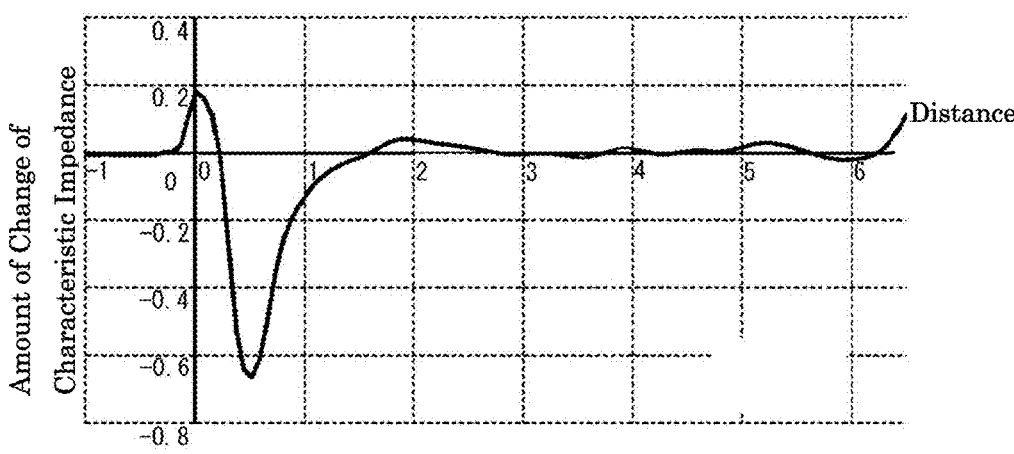
FIGS. 18A to 18C are diagrams each showing the measurement result of characteristic impedance of a straight laminated tape-wound electric wire.
Figure 18B:
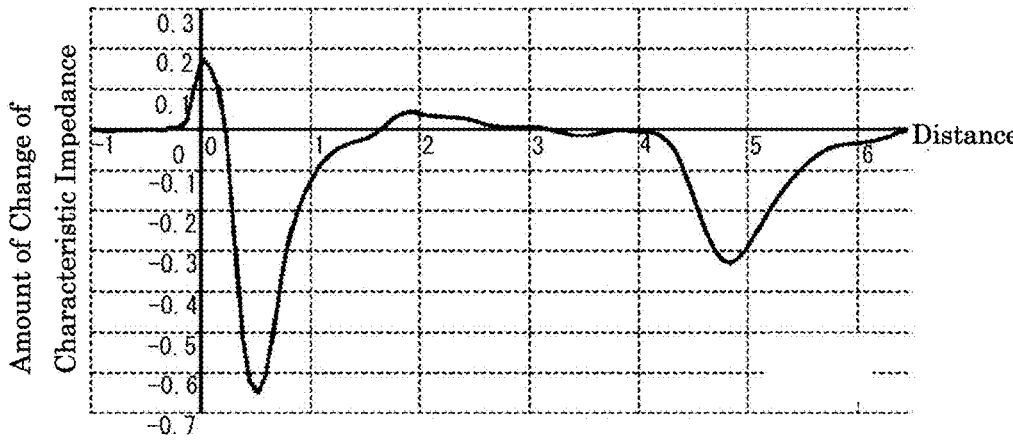
Figure 18C:
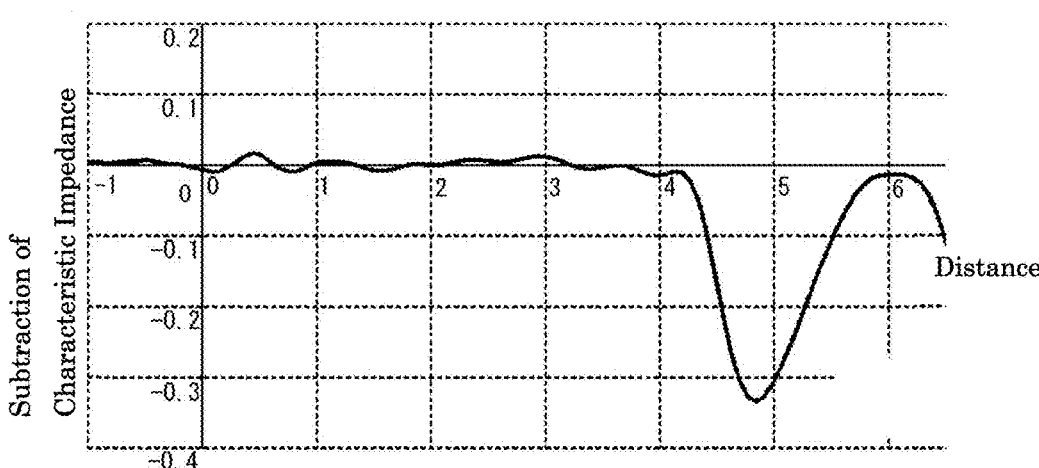

18A shows measurement results of the reflection coefficient under the normal conditions before the short circuit is formed, and FIG. 18B shows measurement results of the reflection coefficient after the short circuit is formed. In the measurement results after the formation of the short circuit in FIG. 18B, a negative peak, which is not observed in the normal measurement results in FIG. 18A, is observed around a distance of 5 m. FIG. 18C shows subtraction obtained by subtracting the values of reflection coefficient obtained before short circuit was formed from the values of reflection coefficient obtained after short circuit was formed. In the subtraction, the structure of the negative peak can be clearly observed.

Thus, in a sample wound with laminated tape, damage can be detected by measuring the reflection coefficient and comparing it with the measurement results obtained under normal conditions, for both cases where breakage is formed in the copper tape as external damage, and where a short circuit is formed as external damage. The position of damage can also be identified. The direction of change in the reflection coefficient is opposite between when breakage is formed as damage and when a short circuit is formed as damage, and therefore the type of damage can be estimated based on the direction of change. The increase of reflection coefficient ρ can be explained by the fact that if breakage is formed in copper tape, $Z_L$ diverges to infinity in formula 1. On the other hand, the decrease of reflection coefficient ρ can be explained by the fact that if a short circuit is formed in the copper tape, $Z_L$ in formula 1 becomes zero.

Although the embodiments of the present disclosure have been described in detail above, the present invention is not limited to the above embodiments, and various modifications can be made without departing from the gist of the present invention. Also, the aspects of the conductive tape-wound electric wire and the laminated tape-wound electric wire described above can be applied to cases other than a case of being inspected by the electric wire inspection system and the electric wire inspection method according to the embodiments of the present disclosure, and according to the present invention, it is possible to perform damage detection and damage position identification with a simple configuration.

LIST OF REFERENCE NUMERALS 1, 1', 1" Conductive tape-wound electric wire
1a, 1b Power supply wire
1c, 1d Communication wire
1e Disconnection detection wire
1f Drain wire
1g Pressure winding layer
1h Sheath
1h1 Inner layer
1h2 Outer layer
1A Base end of electric wire
10, 10' Core wire
10" Core wire (composite wire)
11 Conductor
12 Insulation coating
13A-13C Branched portion
14 Main line
15A-15C Branch line
20 Conductive tape
20' Conductive tape (single-sided conductive tape)
21 Conductive layer
22 Base material
25 Gap 3 Laminated tape-wounded electric wire
30 Core wire (composite wire)
31 Insulated wire
40 Laminated tape
41 Base material
42 Coating layer
43 Adhesive tape
9 Measuring device
A Electric wire inspection system
A1 Inspection unit
A2 Storage unit
A3 Analysis unit
C, C' Electric wire
Cp1-Cp6 Point on electric wire C
c1 Response signal for electric wire C' at first time point
c2 Response signal for electric wire C' at second time point
D External damage
D1 Damage on conductive tape
P Peak
R Change region
S1-S4 Steps of electric wire inspection method

The invention claimed is:

1. An electric wire inspection system for inspecting a damage state of an electric wire,
  the electric wire comprising:
    a core wire comprising a conductor and an insulation coating; and
    a damage detection member comprising two conductive members which are electrically insulated from each other and are composed of at least one of components of the core wire or components of the electric wire other than the core wire disposed along the core wire,
  wherein the electric wire inspection system comprising:
  an inspection unit which performs electric wire inspection at a first time point and a second time point later than the first time point, by inputting to the two conductive members an electrical signal that contains an alternating-current component as an inspection signal, and obtaining by time domain reflectometry or frequency domain reflectometry a characteristic impedance between the two conductive members, as a response signal;
  a storage unit which stores the response signal obtained in the electric wire inspection performed by the inspection unit at the first time point; and
  an analysis unit which retrieves the response signal obtained at the first time point from the storage unit, compare the response signal obtained at the first time point with the response signal obtained in the electric wire inspection performed by the inspection unit at the second time point, and, if a difference exists between the two response signals, correlates a region in which the difference exists in the response signals with a position along an axial direction of the electric wire.

2. The electric wire inspection system according to claim 1,
  wherein the analysis unit calculates a subtraction between the response signal obtained at the first time point and the response signal obtained at the second time point, and determines whether or not the difference exists between the two response signals based on the subtraction.

3. The electric wire inspection system according to claim 1, wherein the inspection signal comprises superimposition of signal components existing over a continuous frequency range and having mutually independent intensities, and has excluded frequencies as a part of the continuous frequency range at which frequency components have no intensities or discontinuously smaller intensities compared to adjacent frequencies, and wherein in the electric wire inspection, the characteristic impedance between the two conductive members is measured as the response signal by time domain reflectometry.

4. The electric wire inspection system according to claim 3, wherein in the inspection signal, the excluded frequencies include a frequency of an electromagnetic wave originating from a source external to the electric wire and propagating around the electric wire.

5. The electric wire inspection system according to claim 1, wherein the electric wire to be inspected has a branched portion in the middle thereof.

6. The electric wire inspection system according to claim 1, wherein the electric wire to be inspected comprises a conductive tape spirally wound around an outer circumference of the core wire, and the conductor of the core wire and the conductive tape constitute the two conductive members of the damage detection member.

7. The electric wire inspection system according to claim 6, wherein the conductive tape comprises:

a base material made of a tape-shaped insulator or a semiconductor; and a conductive layer made of a conductive material and formed on one surface of the base material, wherein the conductive tape is wound around the core wire in a spiral shape without any gaps, and the conductive layer is not in contact with each other between adjacent turns of the spiral shape.

8. The electric wire inspection system according to claim 6, wherein the core wire is a composite wire comprising a plurality of insulated wires each comprising the conductor and the insulation coating surrounding the conductor, and the conductive tape is spirally wound around the outer circumference of the entire composite wire.

9. The electric wire inspection system according to claim 1, wherein the electric wire to be inspected comprises a laminated tape wound around the core wire, the laminated tape comprises:

a base material made of a tape-shaped insulator or a semiconductor; and conductive coating layers formed on both surfaces of the base material, wherein the two coating layers of the laminated tape constitute the two conductive members of the damage detection member.

10. The electric wire inspection system according to claim 9, wherein the core wire is a composite wire comprising a plurality of insulated wires each comprising the conductor and the insulation coating surrounding the conductor, and the laminated tape is spirally wound around the outer circumference of the entire composite wire.

11. The electric wire inspection system according to claim 9, wherein the laminated tape is wound around the core wire in a spiral shape without any gaps, and the coating layers are not in contact with each other between turns of the spiral shape.

12. The electric wire inspection system according to claim 9, wherein the base material has an electrical characteristic that changes depending on external environments.

13. An electric wire inspection method using the electric wire inspection system according to claim 1, the electric wire inspection method comprising:

an initial data obtaining step in which the electric wire inspection of the electric wire is performed by the inspection unit at the first time point and the response signal is obtained;

a data storage step in which the response signal obtained in the initial data obtaining step is stored in the storage unit;

a measurement step in which the electric wire inspection of the electric wire at the second time point is performed by the inspection unit; and an analysis step in which the response signal obtained at the first time point is retrieved by the analysis unit from the storage unit and is compared with the response signal obtained in the measurement step at the second time point, and, if a difference exists between the two response signals, a region in which the difference exists in the response signals is correlated with a position along the axial direction of the electric wire.

14. An electric wire, comprising:

a core wire comprising a conductor and an insulation coating surrounding the conductor; and a conductive tape as detection tape arranged on an outer peripheral surface of the core wire, wherein the conductive tape comprises:

a base material made of a tape-shaped insulator or a semiconductor; and a conductive layer made of a conductive material and formed on one surface of the base material, wherein the conductive tape is wound around the core wire in a spiral shape without any gaps, and the conductive layer is not in contact with each other between adjacent turns of the spiral shape, wherein the electric wire is configured as a composite wire for an electric brake having an external damage detection function, the electric wire comprises at least one of a power supply wire and a communication wire for the electric brake of an automobile, and the detection tape is electrically connected to a measurement unit installed in the electric brake.

15. An electric wire, comprising:

a core wire comprising a conductor and an insulation coating surrounding the conductor; and a laminated tape as detection tape arranged on an outer peripheral surface of the core wire, wherein the laminated tape comprises:

a base material made of a tape-shaped insulator or a semiconductor; and conductive coating layers formed on both surfaces of the base material, wherein the laminated tape is wound around the core wire in a spiral shape without any gaps, and the coating layers are not in contact with each other between adjacent turns of the spiral shape, wherein the electric wire is configured as a composite wire for an electric brake having an external damage detection function, the electric wire comprises at least one of a power supply wire and a communication wire for the electric brake of an automobile, and the detection tape is electrically connected to a measurement unit installed in the electric brake.

16. The electric wire according to claim 14, wherein the core wire is a composite wire comprising a plurality of insulated wires twisted together each comprising the conductor and the insulation coating surrounding the conductor, and the detection tape is spirally wound around the outer circumference of the entire composite wire.

\*    \*    \*    \*    \*